(12) United States Patent
Hashimoto et al.

(10) Patent No.: US 6,462,609 B2
(45) Date of Patent: Oct. 8, 2002

(54) TRIMMING CIRCUIT OF SEMICONDUCTOR APPARATUS

(75) Inventors: Yasuhiro Hashimoto; Katsuya Shimizu, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 9 days.

(21) Appl. No.: 09/816,749

(22) Filed: Mar. 26, 2001

(65) Prior Publication Data
US 2002/0003483 A1 Jan. 10, 2002

(30) Foreign Application Priority Data
Jul. 7, 2000 (JP) ........................................ 2000-206876

(51) Int. Cl.$^7$ .............................................. H01H 85/00
(52) U.S. Cl. ...................................... 327/525; 327/334
(58) Field of Search ................................ 327/334, 530, 327/525, 526

(56) References Cited

U.S. PATENT DOCUMENTS

| | | | |
|---|---|---|---|
| 4,446,534 A | * 5/1984 | Smith | 327/525 |
| 4,686,384 A | * 8/1987 | Harvey et al. | 326/38 |
| 5,276,653 A | * 1/1994 | McKenny | 327/525 |
| 5,361,001 A | * 11/1994 | Stolfa | 327/312 |
| 5,726,585 A | * 3/1998 | Kim | 326/38 |
| 5,838,076 A | * 11/1998 | Zarrabian et al. | 307/115 |
| 6,072,349 A | * 6/2000 | Pippin et al. | 327/307 |
| 6,121,820 A | * 9/2000 | Shishikura | 327/525 |
| 6,255,895 B1 | * 7/2001 | Kim et al. | 327/525 |
| 6,268,760 B1 | * 7/2001 | Marshall et al. | 327/525 |

* cited by examiner

Primary Examiner—Terry D. Cunningham
(74) Attorney, Agent, or Firm—Arent Fox Kintner Plotkin & Kahn, PLLC

(57) ABSTRACT

A relatively compact trimming circuit for hypothetically breaking a fuse includes a resistance bypass circuit connected to a node between a resistor and a fuse. The bypass circuit selectively performs ordinary breakage and hypothetical breakage of the fuse in accordance with a control signal and a data signal. An output changeover circuit connected to the node generates a first output signal in accordance with a state of the fuse during the ordinary breakage. The output changeover circuit generates a second output signal in accordance with the data signal during the hypothetical breakage.

15 Claims, 13 Drawing Sheets

US 6,462,609 B2

TRIMMING CIRCUIT OF SEMICONDUCTOR APPARATUS

BACKGROUND OF THE INVENTION

The present invention relates to a trimming circuit, and more particularly to a fuse trimming circuit for adjusting electric characteristics of a semiconductor integrated circuit.

Conventionally, electric characteristics of a semiconductor integrated circuit are adjusted by breaking a fuse of a trimming circuit before shipment of the circuit. The accuracy of the semiconductor integrated circuit is enhanced by the adjustment. The fuse is broken by applying a current or a voltage to the fuse or by irradiating the fuse with a laser. However, the breakage of the fuse by laser beam irradiation requires a relatively large laser beam generation apparatus, and therefore is not feasible for a manufacturing environment.

In the prior art, it has been difficult to predict exactly what the electric characteristics of the semiconductor integrated circuit will be after the fuse is broken. Therefore, in some cases, a fuse is broken that should not be, and a defective semiconductor integrated circuit is shipped. Therefore, before the fuse is broken, a careful determination of the procedures for testing the characteristics of the circuit and breaking the fuse is required.

To confirm the electric characteristics of the semiconductor integrated circuit before the fuse is broken, a trimming circuit is used to perform hypothetical fuse breakage. The trimming circuit includes a transistor connected in series to a fuse formed of polysilicon (polyfuse). The fuse is brought to a hypothetical broken state by controlling an activated/inactivated state of the transistor. Thereby, the electric characteristics of the semiconductor integrated circuit after the breakage of the fuse are accurately predicted before the breakage, and the fuse to be broken is securely selected.

The trimming circuit includes N polyfuses and N transistors, each connected to one polyfuse, for controlling each hypothetical polyfuse breakage. The trimming circuit further includes a control terminal for receiving a transistor control signal, and N×N trimming terminals. The trimming terminals and control terminal are electrodes (pads) formed on a substrate for connecting the semiconductor integrated circuit to an external lead wire or a bump. The transistors are relatively large sized to bear a high voltage or a large current for breaking the polyfuses. Therefore, the semiconductor integrated circuit including the trimming circuit is relatively large-sized.

Moreover, in order to finely adjust the electric characteristics of the semiconductor integrated circuit, the number of polyfuses is preferably large. However, the number of trimming terminals increases in accordance with the number of polyfuses. Therefore, the trimming terminals, which are used only during trimming, enlarge the semiconductor integrated circuit.

SUMMARY OF THE INVENTION

It is an object of the present invention to provide a relatively compact trimming circuit for hypothetically breaking a fuse.

To achieve the above object, the first aspect of the present invention provides a trimming circuit including a resistor connected to either one of a first power supply and a second power supply and at least one trimming element connected between the other one of the first power supply and the second power supply and the resistor. The trimming circuit further includes at least one resistance bypass circuit, connected to a node between the resistor and the at least one trimming element, for selectively performing ordinary breakage and hypothetical breakage of the trimming element in accordance with a control signal and a data signal. The at least one resistance bypass circuit holds the at least one trimming element in an unbroken state in accordance with the control signal during the hypothetical breakage. The at least one resistance bypass circuit connects the at least one trimming element to the first power supply and the second power supply in accordance with the control signal and the data signal and breaks the trimming element during the ordinary breakage. An output changeover circuit, which is connected to the node, generates a first output signal in accordance with a state of the at least one trimming element during the ordinary breakage and generates a second output signal in accordance with the data signal during the hypothetical breakage.

The second aspect of the present invention provides a trimming circuit including a resistor connected to either one of a first power supply and a second power supply and at least one trimming element connected between the other one of the first power supply and the second power supply and the resistor. The trimming circuit further includes at least one resistance bypass circuit, connected to the at least one trimming element, for supplying the first power supply and the second power supply to the trimming element in accordance with a control signal and a data signal to selectively perform ordinary short-circuit and hypothetical short-circuit of the trimming element. The resistance bypass circuit holds the trimming element in a non-short-circuit state in accordance with the control signal during the hypothetical short-circuit and connects the trimming element to the first power supply and the second power supply in accordance with the control signal and the data signal to short-circuit the trimming element during the ordinary short-circuit. An output changeover circuit, which is connected to the node, generates a first output signal in accordance with a state of the at least one trimming element during the ordinary short-circuit and generates a second output signal in accordance with the data signal during the hypothetical short-circuit.

The third aspect of the present invention provides an adjustment circuit for controlling a plurality of adjustment elements. The adjustment circuit includes a plurality of switch elements connected in parallel with the plurality of adjustment elements, and a plurality of trimming circuits, connected to the plurality of switch elements, for receiving a plurality of data signals and a common control signal. The trimming circuit has a resistor connected to either one of a first power supply and a second power supply, at least one trimming element connected between the other one of the first power supply and the second power supply and the resistor, at least one resistance bypass circuit, connected to a node between the resistor and the at least one trimming element, for selectively performing ordinary breakage and hypothetical breakage of the trimming element in accordance with the control signal and the data signal. The at least one resistance bypass circuit holds the at least one trimming element in an unbroken state in accordance with the control signal during the hypothetical breakage and connects the at least one trimming element to the first power supply and the second power supply in accordance with the control signal and the data signal to break the trimming element during the ordinary breakage. An output changeover circuit is connected to the node to generate a first output signal in accordance with a state of the at least one trimming element during the ordinary breakage, and to generate a second output signal in accordance with the data signal during the hypothetical breakage.

The fourth aspect of the present invention provides a semiconductor apparatus including a plurality of data terminals for receiving a plurality of data signals, a control terminal for receiving a common control signal, a plurality of adjustment elements, a plurality of switch elements connected in parallel with the plurality of adjustment elements, and an adjustment circuit, connected to the plurality of switch elements, the plurality of data terminals and the control terminal, for switching the plurality of switch elements in accordance with the plurality of data signals and the common control signal to control the adjustment element. The adjustment circuit has a plurality of trimming circuits connected to the plurality of switch elements. The trimming circuit includes a resistor connected to either one of a first power supply and a second power supply, at least one trimming element connected between the other one of the first power supply and the second power supply and the resistor, and at least one resistance bypass circuit, connected to a node between the resistor and the at least one trimming element, for selectively performing ordinary breakage and hypothetical breakage of the trimming element in accordance with the control signal and the data signal. The at least one resistance bypass circuit holds the at least one trimming element in an unbroken state in accordance with the control signal during the hypothetical breakage and connects the at least one trimming element to the first power supply and the second power supply in accordance with the control signal and the data signal and breaks the trimming element during the ordinary breakage. The trimming circuit also includes an output changeover circuit for generating a first output signal in accordance with a state of the at least one trimming element during the ordinary breakage, and generating a second output signal in accordance with the data signal during the hypothetical breakage.

The fifth aspect of the present invention provides a semiconductor apparatus including a plurality of data terminals for receiving a plurality of data signals, a control terminal for receiving a common control signal, a plurality of adjustment elements, a plurality of switch elements connected in parallel with the plurality of adjustment elements, and an adjustment circuit, connected to the plurality of switch elements, the plurality of data terminals and the control terminal, for switching the plurality of switch elements in accordance with the plurality of data signals and the common control signal to control the adjustment element. The adjustment circuit has a plurality of trimming circuits connected to the plurality of switch elements. The trimming circuit includes a resistor connected to either one of a first power supply and a second power supply, at least one trimming element connected between the other one of the first power supply and the second power supply and the resistor, and at least one resistance bypass circuit, connected to the at least one trimming element, for supplying the first power supply and the second power supply to the trimming element in accordance with the control signal and the data signal to selectively perform ordinary short-circuit and hypothetical short-circuit of the trimming element. The resistance bypass circuit holds the trimming element in a non-short-circuit state in accordance with the control signal during the hypothetical short-circuit and connects the trimming element to the first power supply and the second power supply in accordance with the control signal and the data signal to short-circuit the trimming element during the ordinary short-circuit. The trimming circuit also contains an output changeover circuit, connected to the node, for generating a first output signal in accordance with a state of the at least one trimming element during the ordinary short-circuit, and generating a second output signal in accordance with the data signal during the hypothetical short-circuit.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
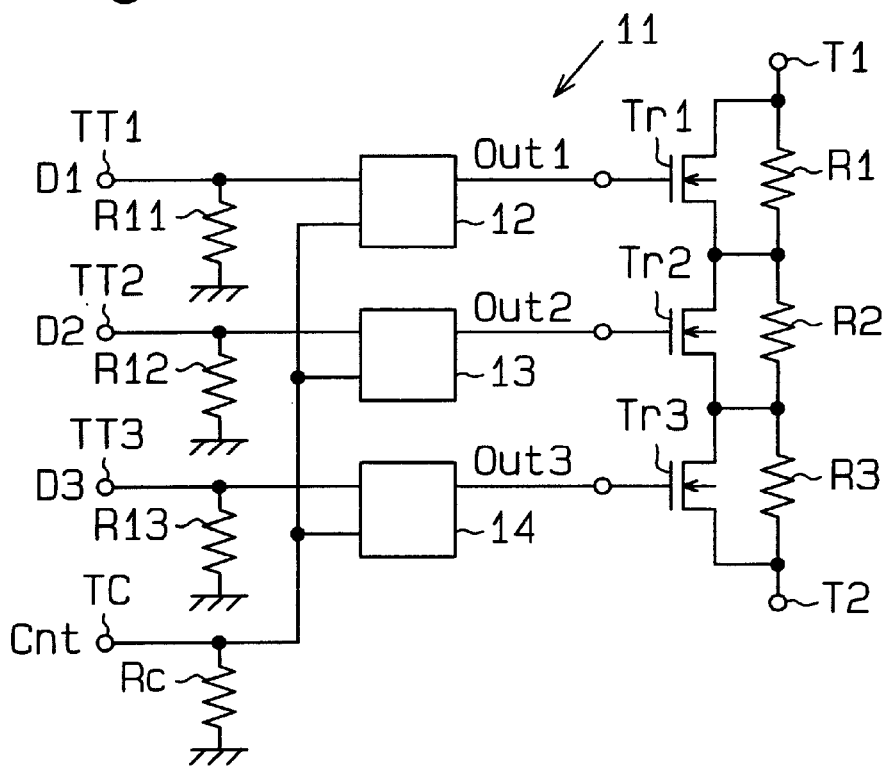
FIG. 1 is a schematic block diagram of an adjustment circuit according to a first embodiment of the present invention.

In the Drawings, like numerals are used for like elements throughout.

First Embodiment

An adjustment circuit 11 according to a first embodiment of the present invention will be described hereinafter.

As shown in FIG. 1, the adjustment circuit 11 includes a plurality of (three in the first embodiment) adjustment elements or resistors R1, R2, R3 connected in series between internal terminals T1, T2. A substantial resistance value between the terminals T1, T2 is adjusted by selectively short-circuiting both ends of each resistor R1, R2, R3. The internal terminals T1, T2 are connected, for example, to a circuit for generating a standard voltage of a semiconductor integrated circuit apparatus. Therefore, the standard voltage is adjusted in accordance with the resistance value between the terminals T1, T2. That is, the electric characteristics of the semiconductor integrated circuit apparatus are adjusted by selectively short-circuiting the resistors R1, R2, R3 before the apparatus is delivered. The resistance value, number and connection form (series, parallel, series/parallel) of the respective resistors between the internal terminals T1 and T2 may appropriately be changed.

The adjustment circuit 11 includes switch elements or transistors Tr1, Tr2, Tr3 and trimming circuits 12, 13, 14 corresponding to the resistors R1, R2, R3.

The transistors Tr1 to Tr3 include N channel MOS transistors, and are connected in parallel to the resistors R1 to R3 respectively. Output signals Out1, Out2, Out3 are supplied respectively to gates of the transistors Tr1 to Tr3 via the trimming circuits 12 to 14. The transistors Tr1 to Tr3 are activated or inactivated by the output signals Out1, Out2, Out3. P channel MOS transistors or bipolar transistors may be used in place of the N channel MOS transistors Tr1 to Tr3. Moreover, a switch element may be formed by the N channel MOS transistors connected in parallel with P channel MOS transistors.

The first, second, and third trimming circuits 12, 13, 14 are connected to trimming terminals TT1, TT2, TT3, respectively. Hypothetical breakage data signals D1, D2, D3 indicating hypothetical breakage are supplied to the trimming circuits 12, 13, 14 via the trimming terminals TT1 to TT3, respectively. Moreover, the respective trimming circuits 12 to 14 are connected to a common control terminal TC. A control signal Cnt is supplied to the trimming circuits 12, 13, 14 via the control terminal TC. Pull-down resistors R11, R12, R13 and Rc are connected to nodes between the trimming circuits 12, 13, 14 and the terminals TT1 to TT3, TC.

The trimming terminals TT1 to TT3 and control terminal TC are electrodes (pads) formed on a one-chip semiconductor integrated circuit substrate. In this manner, the adjustment circuit 11 includes N adjustment elements (three resistors R1, R2, R3) and N+1 pads (four terminals TT1 to TT3, TC), and the number of pads is less than that in the conventional semiconductor integrated circuit.

Figure 2:
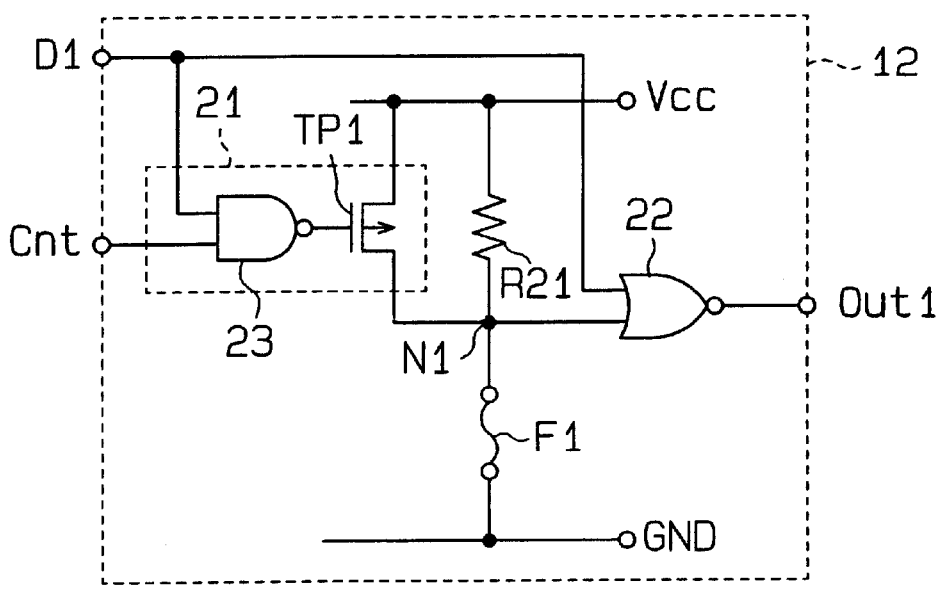
FIG. 2 is a circuit diagram of a trimming circuit of the adjustment circuit of FIG. 1.

FIG. 2 is a schematic circuit diagram of the first trimming circuit 12. The second and third trimming circuits 13, 14 are substantially the same as the first trimming circuit 12.

The first trimming circuit 12 includes a resistor R21, a meltdown type trimming element or a fuse F1, a resistance bypass circuit 21, and an output changeover circuit 22. The resistor R21 and fuse F1 are connected in series between a first power supply (high potential power supply in the first embodiment) Vcc and a second power supply (ground in the first embodiment) GND.

The resistance bypass circuit 21 for selectively applying a breaking voltage (or a breaking current) to the fuse F1 is connected between the first power supply Vcc and the fuse F1. The resistance bypass circuit 21 bypasses the resistor R21 to apply the breaking voltage (or the breaking current) to the fuse F1. Thereby, the fuse F1 is broken.

The resistance bypass circuit 21 includes a P channel MOS transistor (bypass transistor) TP1 and NAND circuit 23. A data signal D1 and control signal Cnt are supplied to two input terminals of the NAND circuit 23, respectively. An output terminal of the NAND circuit 23 is connected to the gate of the bypass transistor TP1. A source of the bypass transistor TP1 is connected to the first power supply Vcc, and a drain thereof is connected to the fuse F1. Therefore, the resistance bypass circuit 21 activates the bypass transistor TP1 in response to the H-level data signal D1 and H-level control signal Cnt. Thereby, a difference potential between the first power supply Vcc and the second power supply GND is applied to both ends of the fuse F1.

The output changeover circuit 22 is preferably a NOR circuit including two input terminals. The data signal D1 is supplied to the first input terminal of the output changeover circuit 22. The second input terminal of the output changeover circuit 22 is connected to a node N1 between the resistor R21 and the fuse F1. The output changeover circuit 22 outputs the output signal Out1 in accordance with the data signal D1 and a potential of the node N1. When the fuse F1 is not broken, the potential of the node N1 indicates a potential (L level) of the second power supply GND. In this case, the output changeover circuit 22 outputs the output signal Out1, which has a reverse level of the data signal D1. On the other hand, when the fuse F1 is broken, the potential of the node N1 indicates a potential (H level) of the first power supply Vcc. In this case, the output changeover circuit 22 outputs the L-level output signal Out1.

When the H-level data signal D1 and H-level control signal Cnt are supplied to the trimming circuit 12, the bypass transistor TP1 is activated by the L-level signal supplied via the NAND circuit 23. Thereby, the fuse F1 is broken by the current flowing between the first and second power supplies Vcc and GND. Moreover, the trimming circuit 12 supplies a L-level output signal Out1 to the transistor Tr1. In this case, since the transistor Tr1 is inactivated, the resistor R1 is not short-circuited.

On the other hand, when a L-level control signal Cnt is supplied, the bypass transistor TP1 is inactivated in the trimming circuit 12. In this case, a L-level signal is supplied to the output changeover circuit 22 via the unbroken fuse F1. Therefore, the output changeover circuit 22 outputs an output signal Out1 with a reverse level of the first data signal D1. The transistor Tr1 is selectively activated, and both ends of the resistor R1 are selectively short-circuited in accordance with the level of the output signal Out1. That is, when the data signal D1 is supplied to inactivate the transistor Tr1, hypothetical breakage is performed. During the hypothetical breakage, states of the transistor Tr1 and resistor R (resistance value between the internal terminals T1 and T2) are substantially the same as those of a point at which the fuse F1 of FIG. 2 is broken.

Additionally, the control terminal TC is connected to the pull-down resistor Rc. Therefore, a state in which no signal is supplied to the control terminal TC is substantially the same as a state in which a L-level control signal Cnt is supplied. This prevents the fuses F1–F3 from being inadvertently broken. If the control terminal TC is disconnected from the pull-down resistor Rc, the level of the control terminal TC reaches a value such that the bypass transistor TP1 is activated because of an influence of a noise or the like, and the fuse F1 is unexpectedly broken.

An operation of the adjustment circuit 11 will next be described.

A. Hypothetical Breakage

In the first trimming circuit 12, the bypass transistor TP1 is inactivated in response to a L-level control signal Cnt. Subsequently, the L-level signal is supplied to the output changeover circuit 22 via the unbroken fuse F1. As a result, the output signal Out1 has the reverse level of the first data signal D1. Similarly, also in the second and third trimming circuits 13, 14, the output signals Out2, Out3 have the reverse levels of the second and third data signals D2, D3. In response to the output signals Out1 to Out3, the transistors Tr1 to Tr3 are activated or inactivated. Thereby, the resistance value between the terminals T1 and T2 is a synthesized resistance value of the resistors R1 to R3 connected in parallel with the inactivated transistors Tr1 to Tr3.

The control terminal TC is pulled down. Therefore, even when the control signal Cnt is not supplied to the control terminal TC, this is substantially the same as when a L-level control signal Cnt is supplied to the control terminal TC. Therefore, the respective trimming circuits 12 to 14 are hypothetically broken only by controlling the potentials of the respective trimming terminals TT1 to TT3. Thereby, the substantial resistance value between the internal terminals T1 and T2 is arbitrarily changed. Subsequently, it is checked whether the resistance value between the internal terminals T1 and T2 is optimum for the operation of the semiconductor apparatus. The fuse to be broken is selected from the first to third trimming circuits 12 to 14 based on a check result.

B. Actual Breakage (Ordinary Breakage)

A H-level control signal Cnt is supplied to the first to third trimming circuits 12 to 14 to break the selected fuse. The fuses of the trimming circuits 12 to 14 are selectively broken in accordance with the levels of the data signals D1, D2, D3.

An example will be described in which the first fuse F1 of the first trimming circuit 12 is selectively broken (trimmed). First, in the hypothetical breakage, a H-level data signal D1 is selectively supplied to the first trimming circuit 12, and a L-level data signals D2, D3 are supplied to the second and third trimming circuits 13, 14. In this state, a H-level control signal Cnt is supplied to the first to third trimming circuits 12 to 14. Then, the bypass transistor TP1 is activated in response to the L-level output signal of the NAND circuit 23. Thereby, the first fuse F1 is broken by a breaking current. On the other hand, in the non-selected second and third trimming circuits 13, 14, since the bypass transistor TP1 is inactivated, the fuse F1 is not broken.

Similarly, the fuse of the second or third trimming circuit 13, 14 is also selectively broken. A plurality of fuses are similarly simultaneously broken.

After trimming, the trimming terminals TT1 to TT3 and control terminal TC are non-connected terminals to which no signal is applied. Moreover, the first transistor Tr1 is inactivated by the L-level signal Out1 of the first trimming circuit 12. The second and third transistors Tr2, Tr3 are activated by the H-level signals of the second and third trimming circuits 13 and 14, respectively. The resistor R1 corresponding to the broken fuse F1 is opened, and the resistors R2, R3 are short-circuited. The adjustment circuit 11 sets an effective resistance value between the internal terminals T1 and T2 in this manner.

According to the first embodiment, the following advantages are obtained.

In the adjustment circuit 11 of the first embodiment, the number (N+1) of pads (trimming terminals TT1 to TT3 and control terminal TC) corresponding to N resistors is reduced. Since the number of pads, which have a relatively large area, is reduced, the size of the adjustment circuit 11 is relatively small. The number of elements for selectively breaking the trimming element F1 is larger than in the conventional art, but the area occupied by each element is relatively small, and the adjustment circuit 11 is therefore relatively small.

Additionally, the first embodiment may be modified as follows.

Instead of the breaking meltdown type fuse F1, another trimming element that can be broken is used based on the result of the hypothetical breakage.

The PMOS transistor TP1 and NAND circuit 23 in the resistance bypass circuit 21 may be replaced by elements (circuit) which can hold the fuse F1 in a unbroken state or which can break the fuse. For example, a resistance bypass circuit including an AND circuit and an NMOS transistor is used. Alternatively, a NAND circuit, an AND circuit, a NOR circuit, an OR circuit, an NPN transistor, and a PNP transistor may appropriately be combined to constitute the resistance bypass circuit in accordance with a logic of a data signal D1, a control signal Cnt and an output signal Out1. Additionally, the logic of the output signal Out1 is also changed in accordance with setting of activated/inactivated state of the transistors Tr1 to Tr3 of FIG. 1, and type of the transistor for use (NMOS transistor or PMOS transistor).

Figure 3:
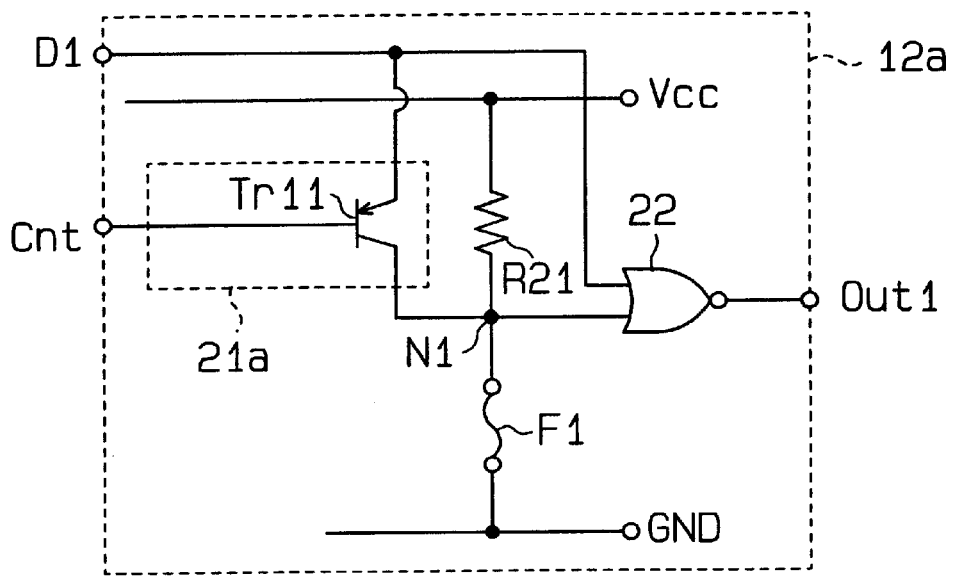
FIG. 3 is a circuit diagram of a first modification of the trimming circuit.

FIG. 3 shows a trimming circuit 12a according to a first modification. A resistance bypass circuit 21a of the trimming circuit 12a includes a PNP transistor (bypass transistor) Tr11. The data signal D1 is inputted to an emitter of the bypass transistor Tr11, a collector thereof is connected to the node N1, and the control signal Cnt is applied to a base of the transistor. During hypothetical breakage, when a potential of the control signal Cnt is set to be equal to or greater than the potential of the data signal D1 (Cnt≧D1), the bypass transistor Tr11 is inactivated. During breakage, when the potential of the control signal Cnt is set to be equal to or less than a difference between the voltage of the data signal D1 and a base-emitter voltage VBE of the bypass transistor Tr11 (Cnt≦D1−VBE), the bypass transistor Tr11 is activated. Therefore, the NAND circuit 23 of FIG. 2 is omitted, and the resistance bypass circuit 21a is relatively small. Moreover, the resistance bypass circuit 21a may consist of a PMOS transistor.

Figure 4:
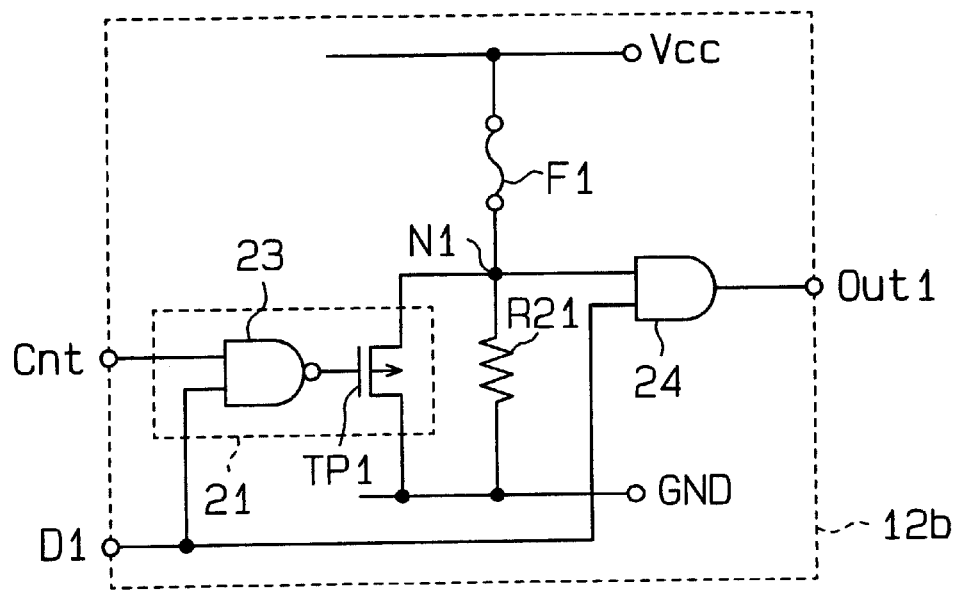
FIG. 4 is a circuit diagram of a second modification of the trimming circuit.

FIG. 4 shows a trimming circuit 12b according to a second modification. In the first embodiment, when the respective terminals TT1 to TT3 and TC are disconnected, the transistors Tr1 to Tr3 are activated. In other words, the trimming circuits 12 to 14 generate H-level signals Out1 to Out3 in response to the L-level control signal Cnt and L-level data signals D1 to D3. On the other hand, in the trimming circuit 12b of FIG. 4, the connection of the respective elements to the first and second power supplies Vcc and GND is switched in comparison with the connection in the trimming circuit 12 of FIG. 2. Moreover, an output changeover circuit 24 including an AND circuit, instead of the NOR circuit 22, is used. In the trimming circuit 12b, the output changeover circuit 24 outputs H-level signal Out1 in response to a L-level control signal Cnt and L-level data signal D1. Furthermore, after the fuse F1 is broken, the L-level signal Out1 is outputted via the output changeover circuit 24.

Figure 5:
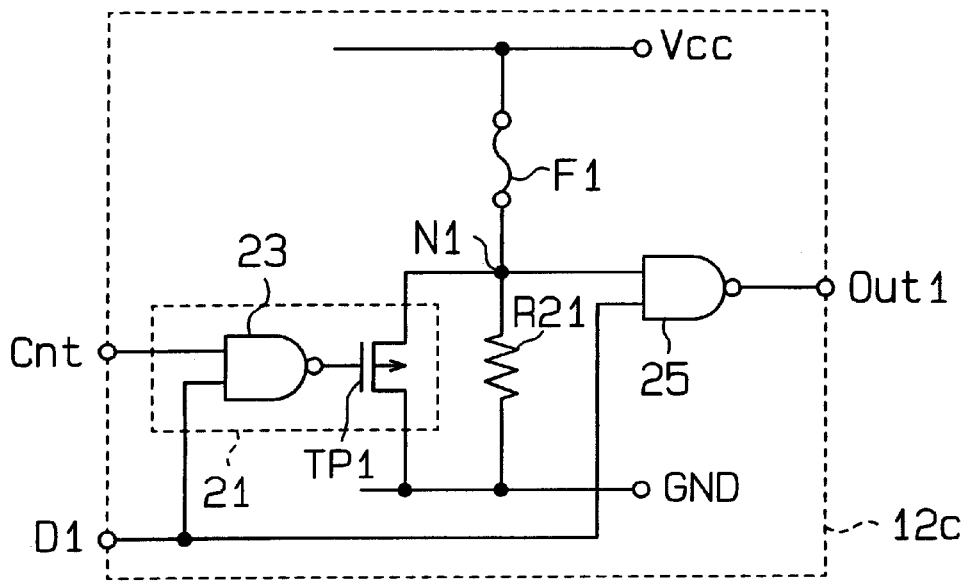
FIG. 5 is a circuit diagram of a third modification of the trimming circuit.

FIG. 5 shows a trimming circuit 12c according to a third modification. The trimming circuit 12c may be used in accordance with the activated/inactivated states or the types (NMOS transistor or PMOS transistor) of the transistors Tr1 to Tr3. In the trimming circuit 12c, an output changeover circuit 25 including a NAND circuit is used instead of the output changeover circuit 24.

Figure 6:
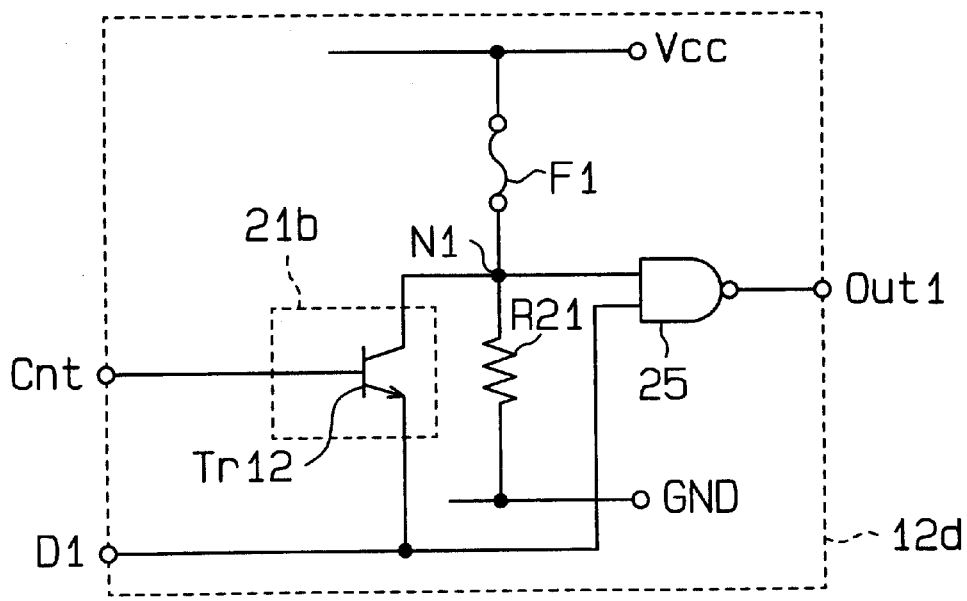
FIG. 6 is a circuit diagram of a fourth modification of the trimming circuit.

FIG. 6 shows a trimming circuit 12d according to a fourth modification. The trimming circuit 12d is provided with a resistance bypass circuit 21b consisting of an NPN transistor Tr12. In this case, during hypothetical breakage, when the voltage of the control signal Cnt is set equal to or less than a voltage of the data signal D1 (Cnt≦D1), the transistor Tr12 is inactivated. During breakage, when the potential of the control signal Cnt is set equal to or more than a total of the voltage of the data signal D1 and the base-emitter voltage VBE (Cnt≧D1+VBE), the transistor Tr12 is activated. Thereby, the NAND circuit 23 is omitted. Moreover, since the NPN transistor is smaller than the PNP transistor Tr11 of FIG. 3, the trimming circuit 12d is miniaturized. Also in this example, the resistance bypass circuit 21b may be replaced with an NMOS transistor.

Figure 7:
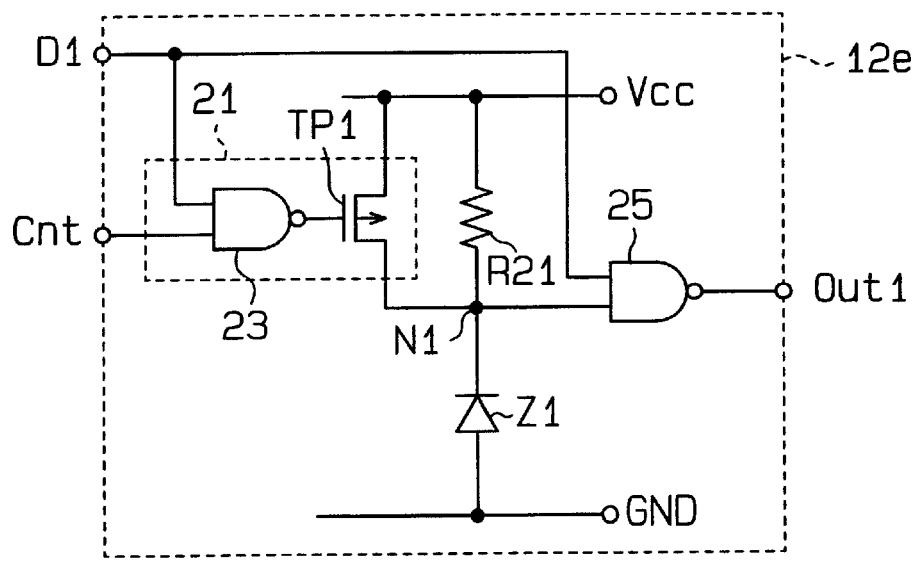
FIG. 7 is a circuit diagram of a fifth modification of the trimming circuit.

FIG. 7 shows a trimming circuit 12e according to a fifth modification. In the trimming circuit 12e, instead of the fuse F1 (meltdown type trimming element), a ZAP diode Z1 (short-circuit type trimming element), which is short-circuited by supplying the first and second power supplies Vcc and GND, is used. In this case, instead of the NOR output changeover circuit 22 of FIG. 2, the NAND output changeover circuit 25 is used. When ZAP diode Z1 is not short-circuited, the trimming circuit 12e outputs the signal Out1 formed by reversing the data signal D1. On the other hand, when the ZAP diode Z1 is short-circuited, the trimming circuit 12e always outputs H-level signal Out1.

In the trimming circuits 12b to 12d of FIGS. 3 to 6, the diode Z1 or another short-circuit element may be used instead of the fuse F1.

Figure 8:
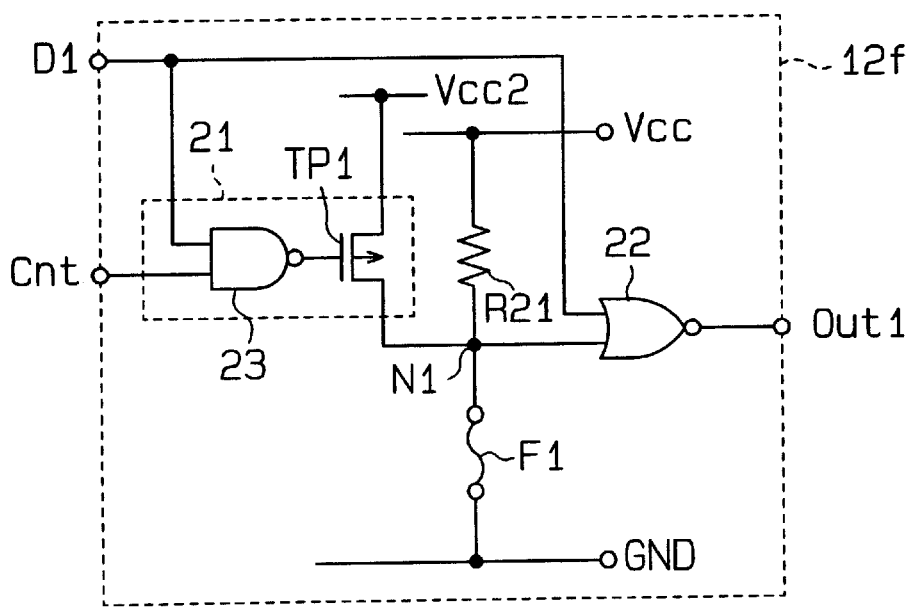
FIG. 8 is a circuit diagram of a sixth modification of the trimming circuit.

In the first embodiment, the source of the bypass transistor TP1 is connected to a first power supply Vcc with a constant voltage, but the source potential may be variable. For example, in a trimming circuit 12f as a sixth modification shown in FIG. 8, the source of the bypass transistor TP1 is connected to a third power supply Vcc2. The fuse F1 is easily broken by controlling the potential of the third power supply Vcc2 to be equal to or more than the potential of the first power supply Vcc (Vcc2≧Vcc).

In the first embodiment, negative-logic signals D1 to D3 and Cnt and pull-up resistors may be used instead of the pull-down resistors R11 to R13 and Rc corresponding to positive-logic data signals D1 to D3 and control signal Cnt.

Second Embodiment

An adjustment circuit 31 according to a second embodiment of the present invention will be described hereinafter with reference to FIGS. 9 and 10.

Figure 9:
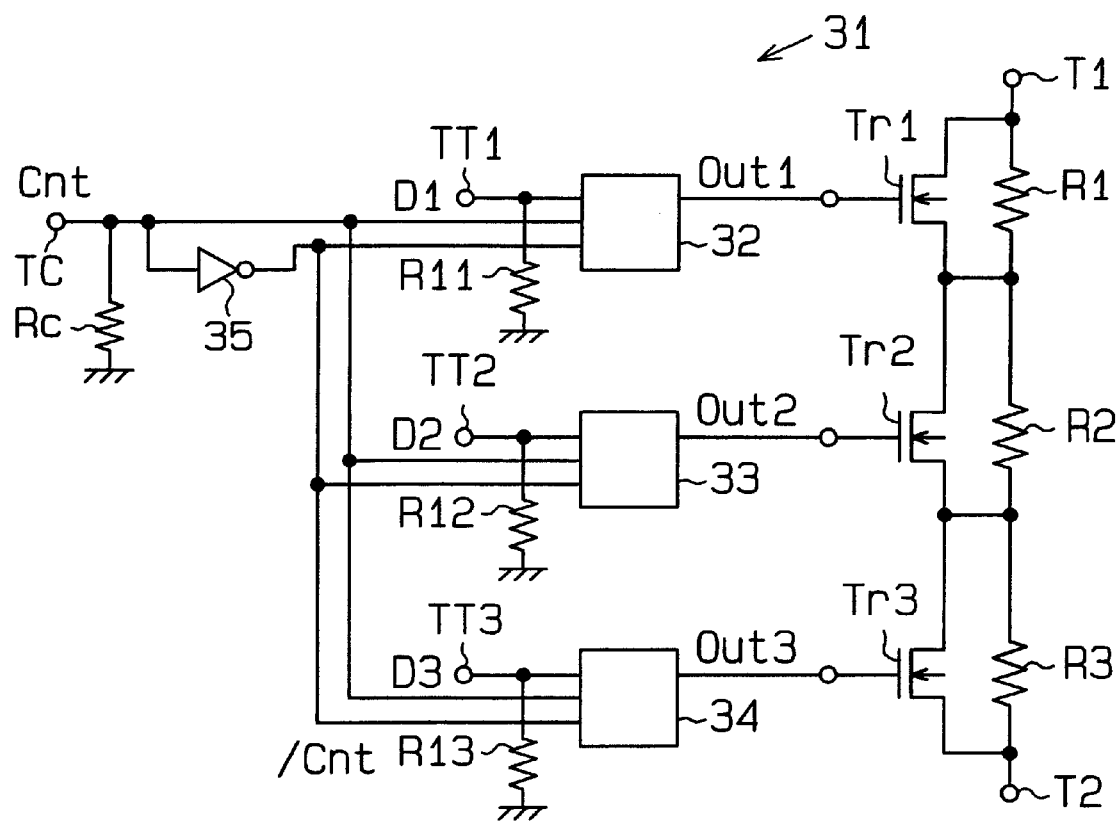
FIG. 9 is a schematic block diagram of an adjustment circuit according to a second embodiment of the present invention.

As shown in FIG. 9, the adjustment circuit 31 includes resistors R1 to R3 (adjustment elements) connected in series between internal terminals T1 and T2, transistors Tr1 to Tr3 (switch elements) for selectively short-circuiting the respective resistors R1 to R3, a plurality of trimming circuits 32, 33, 34 connected to the respective transistors Tr1 to Tr3, and an inverter circuit 35 connected to the transistors Tr1 to Tr3.

Data signals D1 to D3 are supplied to the first, second and third trimming circuits 32 to 34 via trimming terminals TT1 to TT3. Moreover, the control signal Cnt is supplied to the first, second and third trimming circuits 32 to 34 via the control terminal TC, and a reverse control signal/Cnt, a logic reversed version of the control signal Cnt, is supplied to the circuits via the inverter circuit 35. The respective trimming circuits 32 to 34 supply output signals Out1 to Out3 to the corresponding gates of the transistors Tr1 to Tr3. The levels of the output signals Out1 to Out3 are determined in accordance with the data signals D1 to D3, control signal Cnt, reverse control signal/Cnt, and the states of trimming elements F1, F2 in the trimming circuits 32 to 34.

Figure 10:
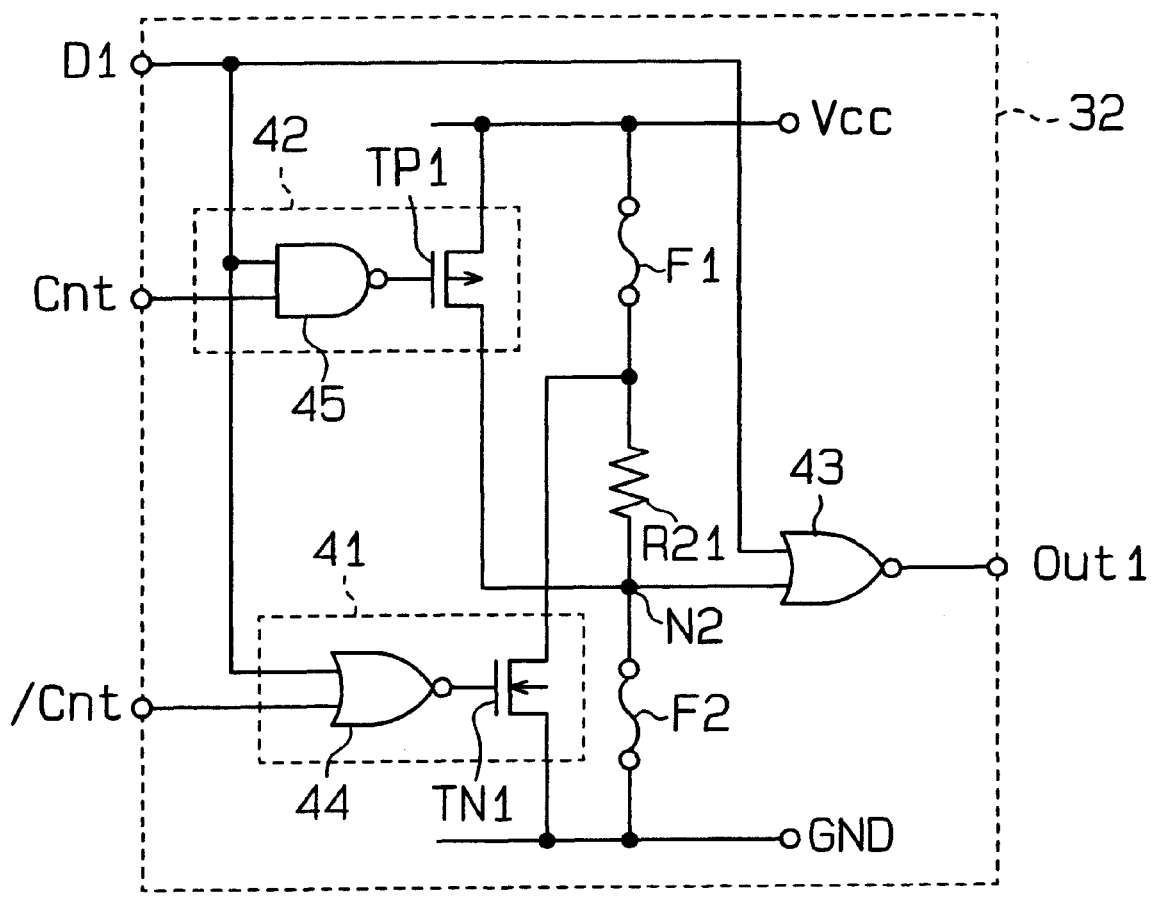
FIG. 10 is a circuit diagram of a trimming circuit of the adjustment circuit of FIG. 9.

FIG. 10 is a circuit diagram of the first trimming circuit 32. The second and third trimming circuits 33, 34 are substantially the same as the first trimming circuit 32.

The first trimming circuit 32 includes a resistor R21, first and second fuses (meltdown type trimming elements) F1 and F2, first and second resistance bypass circuits 41, 42, and an output changeover circuit 43. The first fuse F1, resistor R21 and second fuse F2 are connected in series between the first power supply Vcc and the second power supply (ground) GND.

The first resistance bypass circuit 41 is connected to the node between the resistor R21 and the first fuse F1, and the node between the second fuse F2 and the second power supply GND. The second resistance bypass circuit 42 is connected to the node between the resistor R21 and the second fuse F2, and the node between the first power supply Vcc and the first fuse F1.

The first fuse F1 is trimmed (broken) by activating the first resistance bypass circuit 41. Moreover, the second fuse F2 is trimmed by activating the second resistance bypass circuit 42.

The first resistance bypass circuit 41 includes a NOR circuit 44 and an N channel MOS (NMOS) bypass transistor TN1. The NOR circuit 44 includes two input terminals for receiving the data signal D1 and reverse control signal/Cnt, and an output terminal connected to the gate of the NMOS bypass transistor TN1. The source of the NMOS bypass transistor TN1 is connected to the second power supply GND, and the drain thereof is connected to the node between the first fuse F1 and the resistor R21.

Therefore, the first resistance bypass circuit 41 activates the NMOS bypass transistor TN1 in response to the L-level data signal D1 and L-level reverse control signal/Cnt. Thereby, a difference potential between the first power supply Vcc and the second power supply GND is applied to the first fuse F1, which is then broken. On the other hand, when at least one of the data signal D1 and the reverse control signal/Cnt has an H level, the NMOS bypass transistor TN1 is not activated. In this case, the first fuse F1 is not broken.

The second resistance bypass circuit 42 includes a NAND circuit 45 and P channel MOS (PMOS) bypass transistor TP1. The NAND circuit 45 includes two input terminals for receiving the data signal D1 and the control signal Cnt, and an output terminal connected to the gate of the PMOS bypass transistor TP1. The source of the PMOS bypass transistor TP1 is connected to the first power supply Vcc, and the drain thereof is connected to the node between the resistor R21 and the second fuse F2.

Therefore, the second resistance bypass circuit 42 activates the bypass transistor TP1 in response to a H-level data signal D1 and H-level control signal Cnt. Thereby, the difference potential between the first power supply Vcc and the second power supply GND is applied to the second fuse F2, which is broken. On the other hand, when at least one of the data signal D1 and the control signal Cnt has an L level, the PMOS bypass transistor TP1 is not activated. In this case, the second fuse F2 is not broken.

That is, during ordinary breakage in which the control signal Cnt has an H-level (reverse control signal/Cnt has an L-level), the first or second fuse F1 or F2 is necessarily broken by the first or second resistance bypass circuit 41, 42 in accordance with the level of the data signal D1. This breaks a current path (first fuse F1-resistor R21-second fuse F2) between the first power supply Vcc and the second power supply GND. Therefore, no through current flows, and power consumption of the adjustment circuit 31 is reduced.

The output changeover circuit 43 is preferably a two-input NOR circuit, and includes a first input terminal for receiving the data signal D1, a second input terminal connected to node N2 between the resistor R21 and the second fuse F2, and an output terminal for outputting an output signal Out1.

When the first and second fuses F1, F2 are not broken, the potential of the node N2 is equal to the potential (L-level) of the second power supply GND. In this case, the output changeover circuit 43 outputs the signal Out1, which has a level opposite to that of the data signal D1.

On the other hand, when the first fuse F1 is broken, the potential of the node N2 is equal to the potential (L-level) of the second power supply GND. Moreover, since the trimming terminal TT1 is not used after breaking the fuse F1, the potential of the trimming terminal TT1 is maintained to have an L level by the pull-down resistor R11. Therefore, after the fuse F1 is broken, the output changeover circuit 43 outputs the L-level signal Out1.

When the second fuse F2 is broken, the potential of the node N2 indicates the level (H-level) of the first power supply Vcc, and the output changeover circuit 43 therefore outputs the L-level signal Out1.

According to the second embodiment, the following advantages are obtained.

The resistor R21 is connected to the first and second power supplies Vcc, GND via the first and second fuses F1, F2. Thereby, when the first or second fuse F1, F2 is trimmed based on the result of hypothetical breakage, no through current flows after trimming. As a result, the adjustment circuit 31 has a low power consumption.

The second embodiment may be modified as follows.

A short-circuit trimming element such as a ZAP diode may be used instead of the first or second fuse F1, F2.

Figure 11:
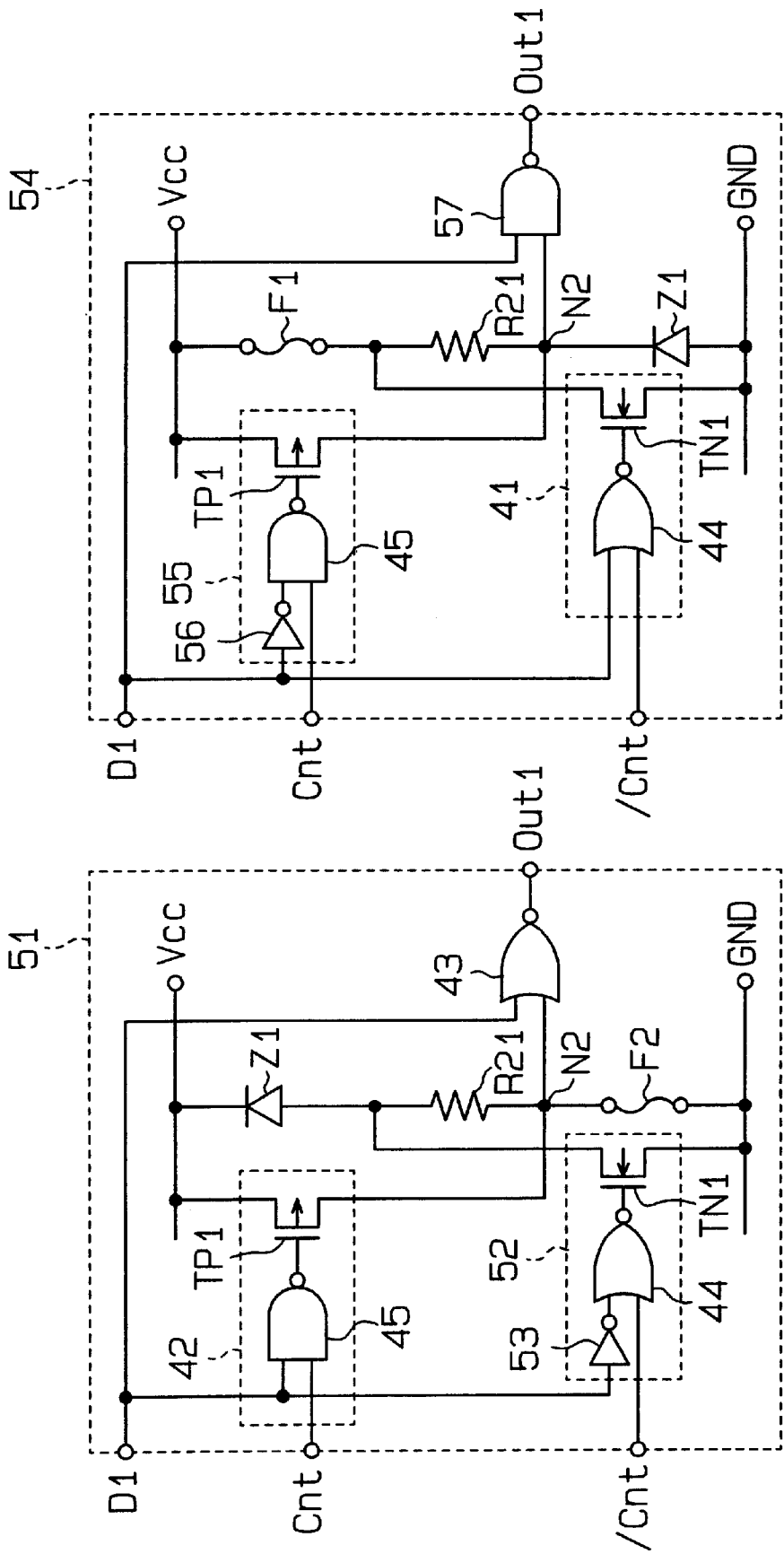
FIG. 11A is a circuit diagram of a seventh modification of the trimming circuit.
FIG. 11B is a circuit diagram of an eighth modification of the trimming circuit.

For example, FIG. 11A shows a trimming circuit 51 as a seventh modification. In the trimming circuit 51, instead of the first fuse F1 of FIG. 10, a diode Z1 is used. The diode Z1 and fuse F2 can simultaneously be collapsed (the fuse F2 is broken, and the diode Z1 is short-circuited) by first and second resistance bypass circuits 52, 42. The first resistance bypass circuit 52 is provided with an NMOS transistor TN1, a NOR circuit 44 connected to the NMOS transistor TN1, and an inverter circuit 53 connected to the NOR circuit 44. The inverter circuit 53 supplies a signal opposite to the data signal D1 to the NOR circuit 44. The NOR circuit 44 controls the NMOS transistor TN1 in accordance with the reverse signal.

FIG. 11B shows a trimming circuit 54 as an eighth modification. In the trimming circuit 54, instead of the second fuse F2 of FIG. 10, a diode Z1 is used. The fuse F1 and diode Z1 can simultaneously be collapsed by first and second resistance bypass circuits 41, 55. Instead of the NOR output changeover circuit 43 of FIG. 10, NAND output changeover circuit 57 is used for the diode Z1 connected to the second power supply GND. The NAND output changeover circuit 57 outputs the reverse signal Out1 of the data signal D1. The second resistance bypass circuit 55 is provided with PMOS bypass transistor TP1, NAND circuit 45 connected to the PMOS bypass transistor TP1, and inverter circuit 56 connected to the NAND circuit 45. The inverter circuit 56 supplies a signal opposite to the data signal D1 to the NAND circuit 45.

In the trimming circuits 51, 54 of FIGS. 11A, 11B, as for the second embodiment, no through current flows after trimming and the power consumption is relatively low.

Third Embodiment

A trimming circuit 61 according to a third embodiment of the present invention will be described hereinafter with reference to FIG. 12.

The trimming circuit 61 includes a resistor R21, first and second fuses (meltdown type trimming elements) F11, F12, a first resistance bypass circuit 62, a second resistance bypass circuit 63 and an output changeover circuit 64. The resistor R21 and first and second fuses F1 and F12 are connected in series between the first power supply Vcc and second power supply (ground) GND. The first fuse F1 is a redundancy trimming element.

The redundancy trimming element is used for the following reasons. When a disconnected fuse is subsequently connected, electric characteristics such as the resistance value after trimming deviate from desired values. In order to enhance the reliability of trimming of the trimming circuit 61, the trimming circuit 61 is provided with the redundancy fuse F11. The probability that all of a plurality of fuses will be reconnected is low, and the trimming circuit 61 is therefore securely maintained in a disconnected state.

To realize redundancy, the first resistance bypass circuit 62 breaks only the second fuse F12. Moreover, the second resistance bypass circuit 63 cooperates with the first resistance bypass circuit 62 to break the first fuse F11.

This will be described in detail. The first resistance bypass circuit 62 is connected to a node N11 between the first fuse F11 and the second fuse F12, and first power supply Vcc. The first resistance bypass circuit 62 includes a NAND circuit 65 and a PMOS bypass transistor TP1. The NAND circuit 65 includes input terminals for receiving a first control signal Cnt1 and data signal D1, respectively, and an output terminal connected to the gate of the bypass transistor TP1. The source of the bypass transistor TP1 is connected to the first power supply Vcc, and the drain thereof is connected to the node N11. The first resistance bypass circuit 62 activates the bypass transistor TP1 in response to the first control signal Cnt1 and data signal D1, and connects the node N11 to the first power supply Vcc. Thereby, the first and second power supplies Vcc and GND are applied to both ends of the second fuse F12, which is broken.

The second resistance bypass circuit 63 is connected to a node N12 between the resistor R21 and the first fuse F1 and to the second power supply GND. The second resistance bypass circuit 63 includes an AND circuit 66 and an NMOS bypass transistor TN1. The AND circuit 66 includes two input terminals for receiving a second control signal Cnt2 and data signal D1, and an output terminal connected to the gate of the transistor TN1. The source of the transistor TN1 is connected to the node N12, and the drain thereof is connected to the second power supply GND. The second resistance bypass circuit 63 activates the transistor TN1 in response to the second control signal Cnt2 and data signal D1, and connects the node N12 to the second power supply GND. In this case, the first resistance bypass circuit 62 connects the first power supply Vcc to the node N11. The first and second power supplies Vcc, GND are applied to both ends of the first fuse F11, which is broken.

The output changeover circuit 64 is a two-input NOR circuit including: a first input terminal for receiving the data signal D1; a second input terminal connected to node N12; and an output terminal for outputting an output signal Out1.

According to the third embodiment, the following advantages are obtained.

The first and second fuses F11, F12 are connected in series between the resistor R21 and the second power supply GND. When the second fuse F12 is broken and subsequently reconnected, the first fuse F1 is broken. A possibility of reconnection of both fuses F11, F12 is so low that incorrect operation of the trimming circuit 61 is reduced.

Fourth Embodiment

Figure 13:
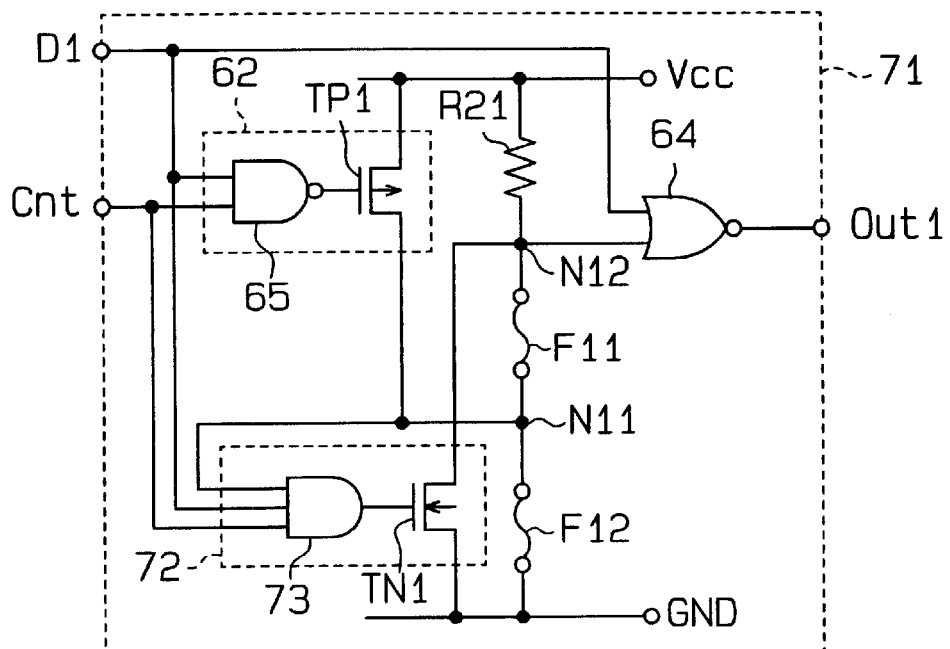
FIG. 13 is a circuit diagram of a trimming circuit according to a fourth embodiment of the present invention.

A trimming circuit 71 according to a fourth embodiment of the present invention will be described hereinafter with reference to FIG. 13.

The trimming circuit 71 includes a resistor R21, first and second fuses F11, F12, a first resistance bypass circuit 62, a second resistance bypass circuit 72 and an output changeover circuit 64. The resistor R21 and first and second fuses F11 and F12 are connected in series between the first power supply Vcc and the second power supply (ground) GND. The first fuse F11 is a redundancy trimming element. This redundancy trimming element enhances the reliability of the disconnected state.

To realize redundancy, the first resistance bypass circuit 62 breaks only the second fuse F12. Moreover, the second resistance bypass circuit 72 cooperates with the first resistance bypass circuit 62 to break the first fuse F11.

An AND circuit 73 includes a first input terminal for receiving the control signal Cnt, a second input terminal for receiving the data signal D1, a third input terminal connected to the node N11 between the first and second fuses F11 and F12, and an output terminal connected to the gate of the transistor TN1.

When the first and second fuses F11, F12 are not broken, the potential of the node N11 is set to that of the second power supply GND (L-level) by the second fuse F12. In this case, in the second resistance bypass circuit 72, the NMOS bypass transistor TN1 is inactivate regardless of the levels of the data signal D1 and control signal Cnt.

Subsequently, the first resistance bypass circuit 62 breaks the second fuse F12 based on the result of hypothetical breakage. When the second fuse F12 is broken, the potential of the node N11 has an H-level. Therefore, in the second resistance bypass circuit 72, the NMOS transistor TN1 is activated in response to the data signal D1 and control signal Cnt. Thereby, the first fuse F11 is also broken.

That is, in the trimming circuit 71, when the second fuse F12 is broken based on the control signal Cnt and data signal D1, the first fuse F11 is also automatically broken. Since two fuses F11, F12 are broken, even when one of the fuses F11, F12 is reconnected, a probability that the node N12 is connected to the second power supply GND is low. As a result, the incorrect operation of the trimming circuit 71 is reduced.

According to the fourth embodiment, the following advantages are obtained.

In response to the breakage of the second fuse F12, the first fuse F11 is automatically broken by the first and second resistance bypass circuits 62 and 72. Since a possibility of reconnection of two fuses F11, F12 is low, the incorrect operation of the trimming circuit 71 is reduced.

Fifth Embodiment

Figure 14A:
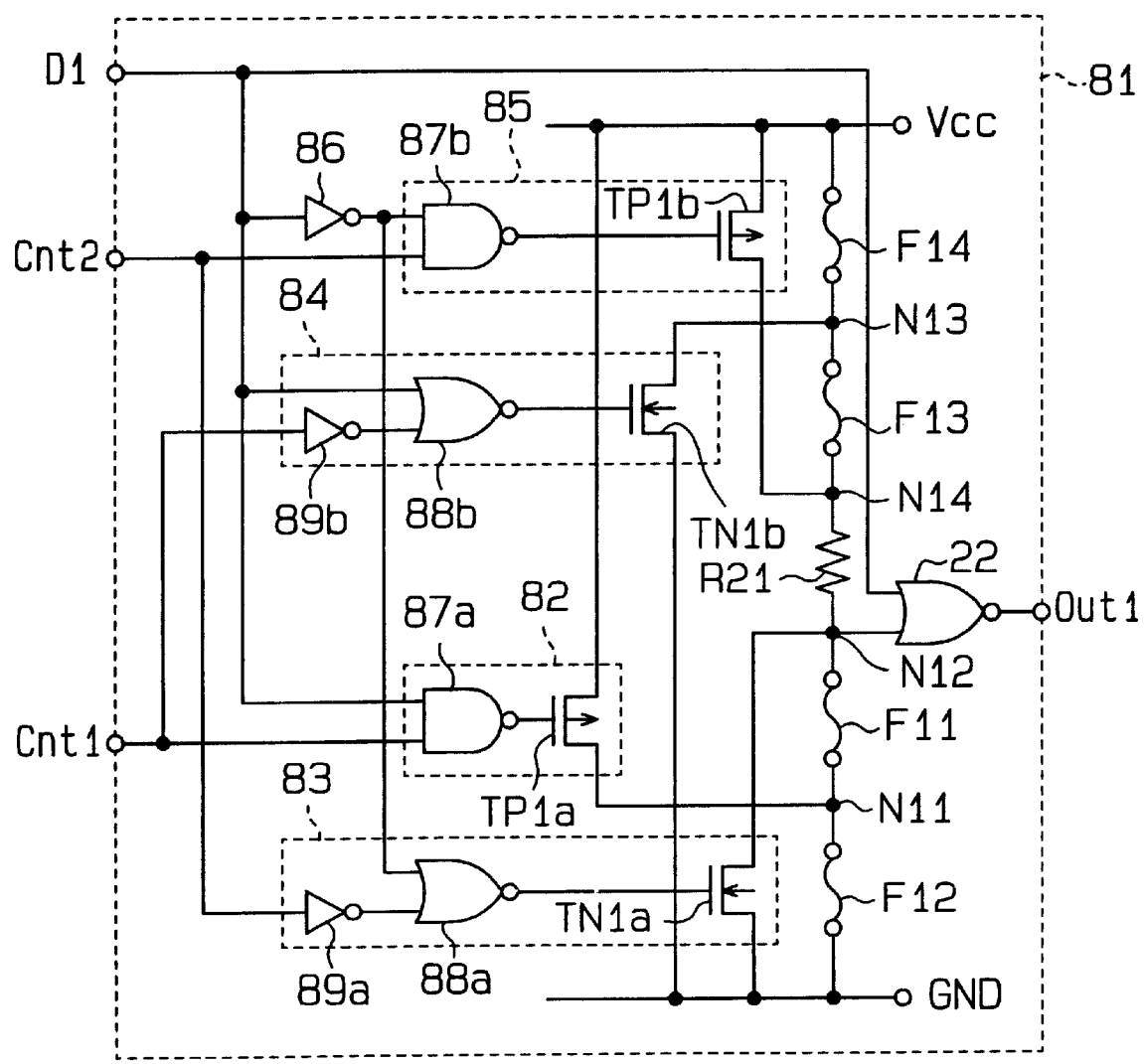
FIG. 14A is a circuit diagram of a trimming circuit according to a fifth embodiment of the present invention.

A trimming circuit 81 according to a fifth embodiment will be described hereinafter with reference to FIG. 14A.

The trimming circuit 81 has a redundancy fuse and reduced power consumption. That is, the trimming circuit 81 includes first and second fuses F11, F12 connected in series between the resistor R21 and the second power supply GND, third and fourth fuses F13, F14 connected in series between the resistor R21 and the first power supply Vcc, first to fourth resistance bypass circuits 82, 83, 84, 85 for selectively breaking the first to fourth fuses F11, F12, F13, F14, an inverter circuit 86, and an output changeover circuit 22.

The first resistance bypass circuit 82 includes a PMOS transistor TP1a connected between the node N11 between the first and second fuses F11, F12 and the first power supply Vcc, and a NAND circuit 87a connected to the PMOS transistor TP1a. The NAND circuit 87a includes two input terminals for receiving the data signal D1 and first control signal Cnt1.

The first resistance bypass circuit 82 controls the transistor TP1a based on the data signal D1 and first control signal Cnt1. When the transistor TP1a is activated, the first power supply Vcc is supplied to the node N11, and the second fuse F12 is broken.

The second resistance bypass circuit 83 includes an NMOS transistor TN1a connected between the node N12 and the second power supply GND, a NOR circuit 88a connected to the NMOS transistor TN1a, and an inverter circuit 89a connected to the NOR circuit 88a. The inverter circuit 89a supplies the reverse signal of the second control signal Cnt2 to a first input terminal of the NOR circuit 88a. The reverse signal of the data signal D1 is supplied to a second input terminal of the NOR circuit 88a via the inverter circuit 86.

The transistor TN1a of the second resistance bypass circuit 83 is controlled to be activated/inactivated by the data signal D1 and second control signal Cnt2. When the transistor TN1a is activated, the second power supply GND is supplied to the node N12. Moreover, the first resistance bypass circuit 82 supplies the first power supply Vcc to the node N11. Thereby, the first fuse F11 is broken.

The third resistance bypass circuit 84 includes an NMOS transistor TN1b connected between a node N13 between the third and fourth fuses F13, F14 and the second power supply GND, a NOR circuit 88b connected to the gate of the NMOS transistor TN1b, and an inverter circuit 89b for supplying the reverse signal of the first control signal Cnt1 to the NOR circuit 88b. Furthermore, the data signal D1 is supplied to the NOR circuit 88b.

The third resistance bypass circuit 84 controls the transistor TN1b based on the reverse signal of the data signal D1 and the first control signal Cnt1. When the transistor TN1b is activated, the second power supply GND is supplied to the node N13, and the fourth fuse F14 is broken.

The fourth resistance bypass circuit 85 includes a PMOS transistor TP1b connected to a node N14 between the resistor R21 and the third fuse F13 and to the first power supply Vcc, and a NAND circuit 87b connected to the PMOS transistor TP1b. The NAND circuit 87b includes an output terminal connected to the gate of the PMOS transistor TP1b, a first input terminal for receiving the second control signal Cnt2, and a second input terminal for receiving the reverse signal of the data signal D1 via the inverter circuit 86.

The fourth resistance bypass circuit 85 controls the transistor TP1b based on the reverse signal of the data signal D1 and the second control signal Cnt2. When the transistor TP1b is activated, the first power supply Vcc is supplied to the node N14, the second power supply GND is supplied to the node N13 via the third resistance bypass circuit 84, and the third fuse F13 is broken.

In the trimming circuit 81, when a H-level first control signal Cnt1 and L-level second control signal Cnt2 are supplied, the second or fourth fuse F12, F14 is broken in accordance with the level of the data signal D1 based on the hypothetical breakage result. If the broken second or fourth fuse F12, 14 is reconnected, the H-level first and second control signals Cnt1, Cnt2 are supplied, and the first or third fuse F11, F13 is broken.

When the fourth or second fuse F14 or F12 (or the third or first fuse F13 or F11 after reconnection) is broken, the through current is prevented from flowing to the second power supply GND from the first power supply Vcc, and power consumption is reduced.

According to the fifth embodiment, the following advantages are obtained.

When the first to fourth fuses F11, F12, F13, F14 connected in series between the first power supply Vcc and the second power supply GND are appropriately broken, the reliability of the broken state is enhanced, and incorrect operation of the trimming circuit 81 is reduced. Moreover, power consumption of the trimming circuit 81 is reduced.

Figure 14B:
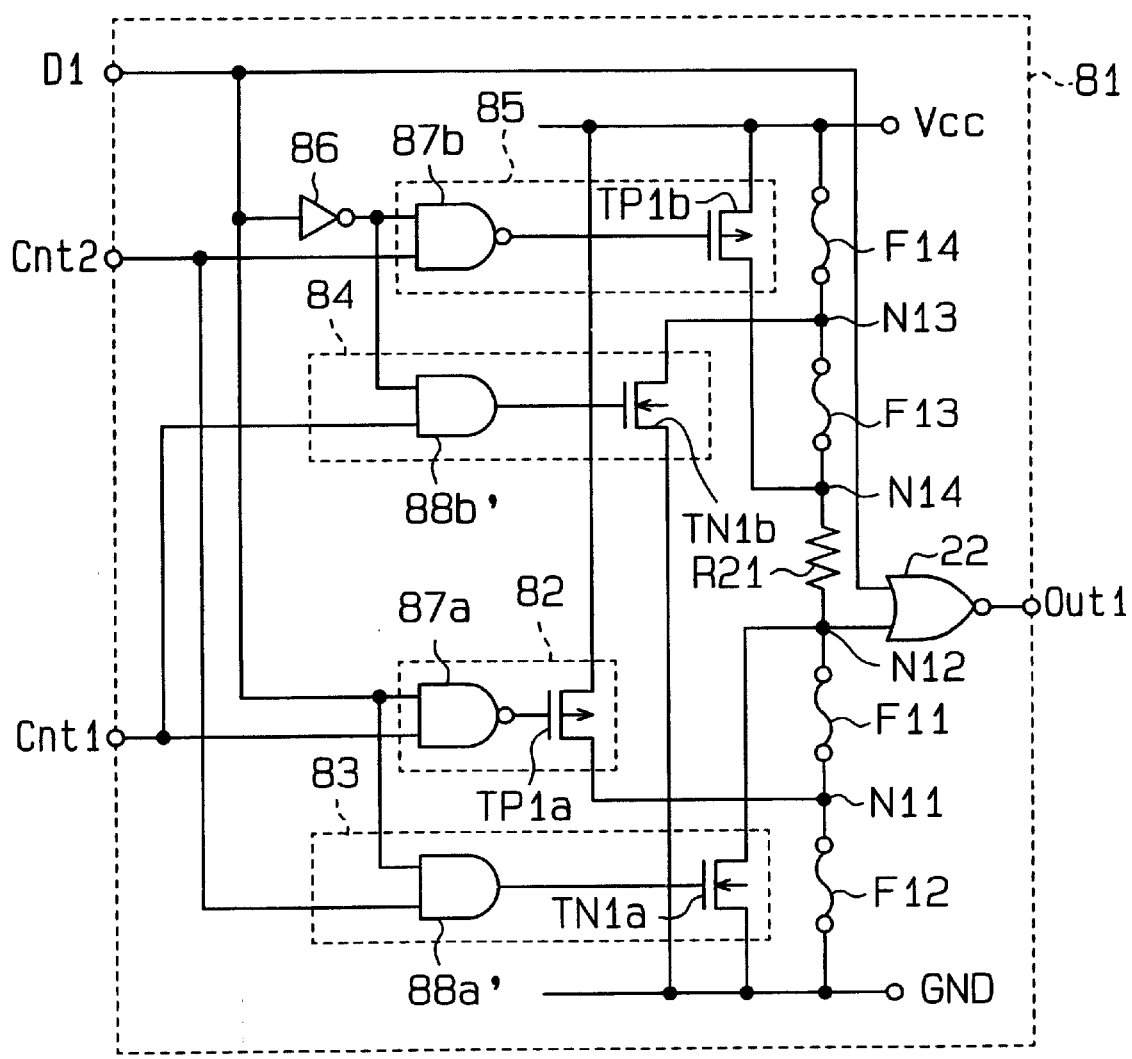
FIG. 14B is a circuit diagram of a trimming circuit according to a modification of FIG. 14A.

The trimming circuit 81 according to the fifth embodiment can be modified as shown in FIG. 14B. The trimming circuit 81 of FIG. 14B includes AND circuits 88a' and 88b' in the second and the third resistance bypass circuits 83 and 84, respectively. The AND circuit 88a' receives the data signal D1 and the control signal Cnt2. The AND circuit 88b' receives the control signal Cnt1 and the reverse signal of the data signal D1 via the inverter circuit 86. In this case, the trimming circuit 81 of FIG. 14B can perform trimming similar to that of FIG. 14A.

Sixth Embodiment

Figure 15:
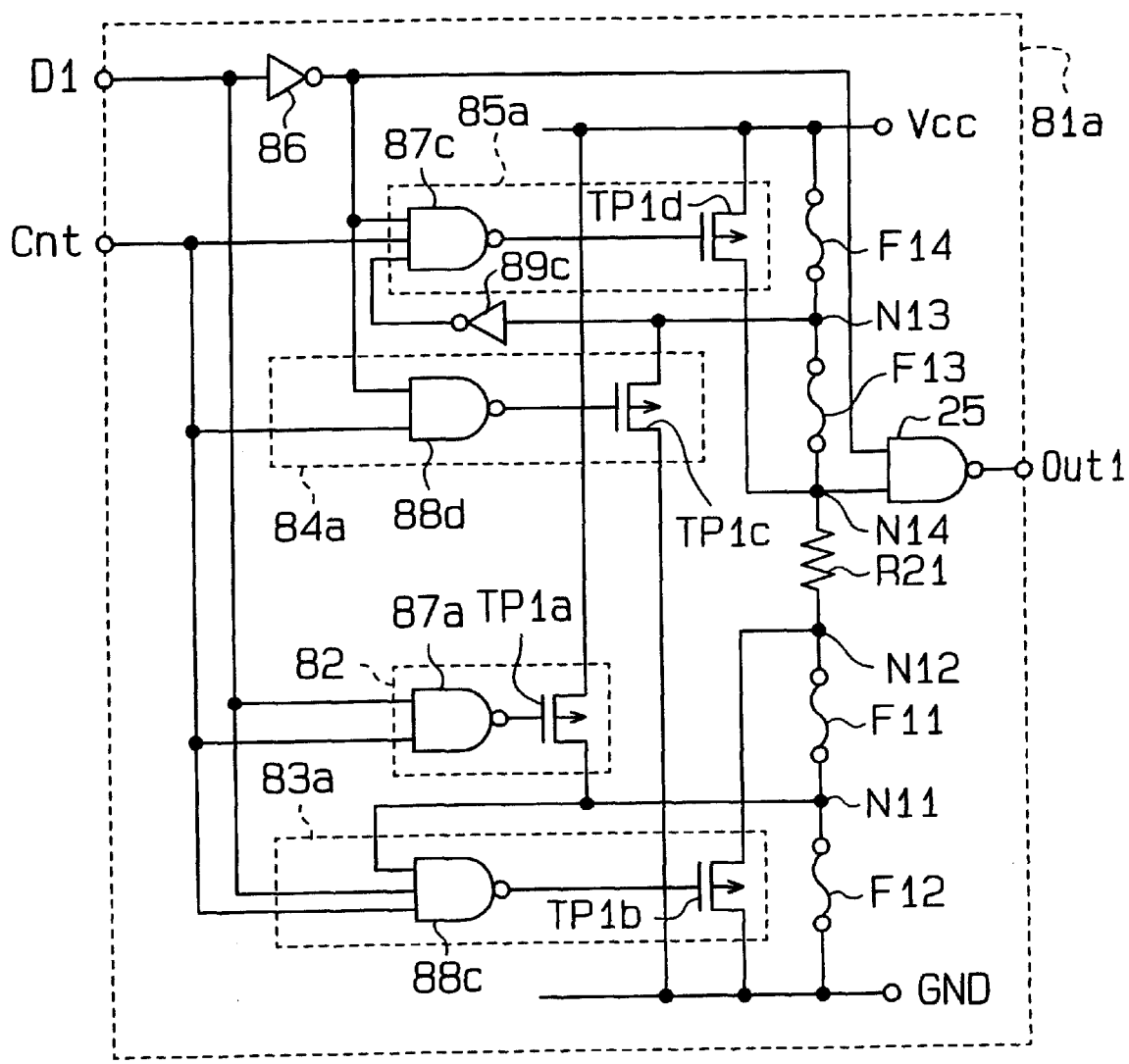
FIG. 15 is a circuit diagram of a trimming circuit according to a sixth embodiment of the present invention.

A trimming circuit 81a according to a sixth embodiment will be described hereinafter with reference to FIG. 15.

In the trimming circuit 81a, through current is prevented. That is, the trimming circuit 81a includes first and second fuses F11, F12 connected in series between the resistor R21 and the second power supply GND, third and fourth fuses F13, F14 connected in series between the resistor R21 and the first power supply Vcc, first to fourth resistance bypass circuits 82, 83a, 84a, 85a for selectively breaking the first to fourth fuses F11, F12, F13, F14, inverter circuits 86, 89c, and an output changeover circuit 25.

The first resistance bypass circuit 82 includes a PMOS transistor TP1a connected between the node N11 between the first and second fuses F11, F12 and the first power supply Vcc, and a NAND circuit 87a connected to the PMOS transistor TP1a. The NAND circuit 87a includes an output terminal connected to the gate of the PMOS transistor TP1a, and two input terminals for receiving the data signal D1 and control signal Cnt, respectively.

The first resistance bypass circuit 82 controls the transistor TP1a in accordance with the data signal D1 and control signal Cnt. When the transistor TP1a is activated, the first power supply Vcc is supplied to the node N11, and the second fuse F12 is broken.

The second resistance bypass circuit 83a includes a PMOS transistor TP1b connected to the node N12 and second power supply GND, and a NAND circuit 88c connected to the PMOS transistor TP1b. The NAND circuit 88c includes an output terminal connected to the gate of the PMOS transistor TP1b, a first input terminal for receiving the data signal D1, a second input terminal for receiving the control signal Cnt, and a third input terminal connected to the node N11.

The second resistance bypass circuit 83a controls the transistor TP1b in accordance with the data signal D1, the control signal Cnt and the potential of the node N11. In other words, the second resistance bypass circuit 83a cooperates with the first resistance bypass circuit 82 to control the transistor TP1b. Therefore, when the second fuse F12 is broken, the first fuse F11 is also automatically broken.

The third resistance bypass circuit 84a includes a PMOS transistor TP1c connected between the node N13 between the third and fourth fuses F13, F14 and the second power supply GND, and NAND circuit 88d connected to the PMOS transistor TP1c. The NAND circuit 88d includes an output terminal connected to the gate of the PMOS transistor TP1c, a first input terminal for receiving the control signal Cnt, and a second input terminal for receiving the reverse signal of the data signal D1 reversed by the inverter circuit 86.

The third resistance bypass circuit 84a controls the transistor TP1c in accordance with the reverse signal of the data signal D1 and control signal Cnt. When the transistor TP1c is activated, the second power supply GND is supplied to the node N13, and the fourth fuse F14 is broken.

The fourth resistance bypass circuit 85a includes a PMOS transistor TP1d connected between the node N14 between the resistor R21 and the third fuse F13 and the first power supply Vcc, and a NAND circuit 87c connected to the PMOS transistor TP1d. The NAND circuit 87c includes an output terminal connected to the gate of the PMOS transistor TP1d, a first input terminal for receiving the control signal Cnt, a second input terminal for receiving the reverse signal of the data signal D1 reversed by the inverter circuit 86, and a third input terminal for receiving the reverse signal of the potential of the node N13 reversed by the inverter circuit 89c.

The fourth resistance bypass circuit 85a controls the transistor TP1d in accordance with the reverse signal of the data signal D1, control signal Cnt and reverse potential of the node N13. In other words, the fourth resistance bypass circuit 85a cooperates with the third resistance bypass circuit 84a to control the transistor TP1d. Therefore, when the fourth fuse F14 is broken, the third fuse F13 is also automatically broken.

The output changeover circuit 25 is preferably a NAND circuit. The output changeover circuit 25 is connected to the inverter circuit 86 and to the node N14. The output changeover circuit 25 outputs the output signal Out1 in accordance with the reverse signal of the data signal D1 and the potential of the node N14.

Therefore, as seen from the first to sixth embodiments, the output changeover circuit (22, 24, 25, 43, 57, 64) is connected to either the first power supply Vcc side terminal or the second power supply GND side terminal in accordance with the logic of the data signal D1.

According to the sixth embodiment, the following advantages are obtained.

(1) When the first and second fuses F11, F12 are broken, the probability of reconnection of the resistor R21 to the second power supply GND is reduced. Moreover, when the third and fourth fuses F13, F14 are broken, the probability of reconnection of the resistor R21 to the first power supply Vcc is reduced. Therefore, the reliability of the trimming circuit 81a is enhanced.

(2) The first and second fuses F11, F12, or the third and fourth fuses F13, F14 are broken in accordance with the reverse signal of the data signal D1 supplied via the inverter circuit 86. As a result, no through current flows between the first power supply Vcc and the second power supply GND, and the power consumption is reduced.

The sixth embodiment may be modified as follows.

The respective resistance bypass circuits 82, 83a, 84a, 85a may contain an AND circuit and an NMOS transistor instead of the NAND circuit and PMOS transistor.

Seventh Embodiment

Figure 16:
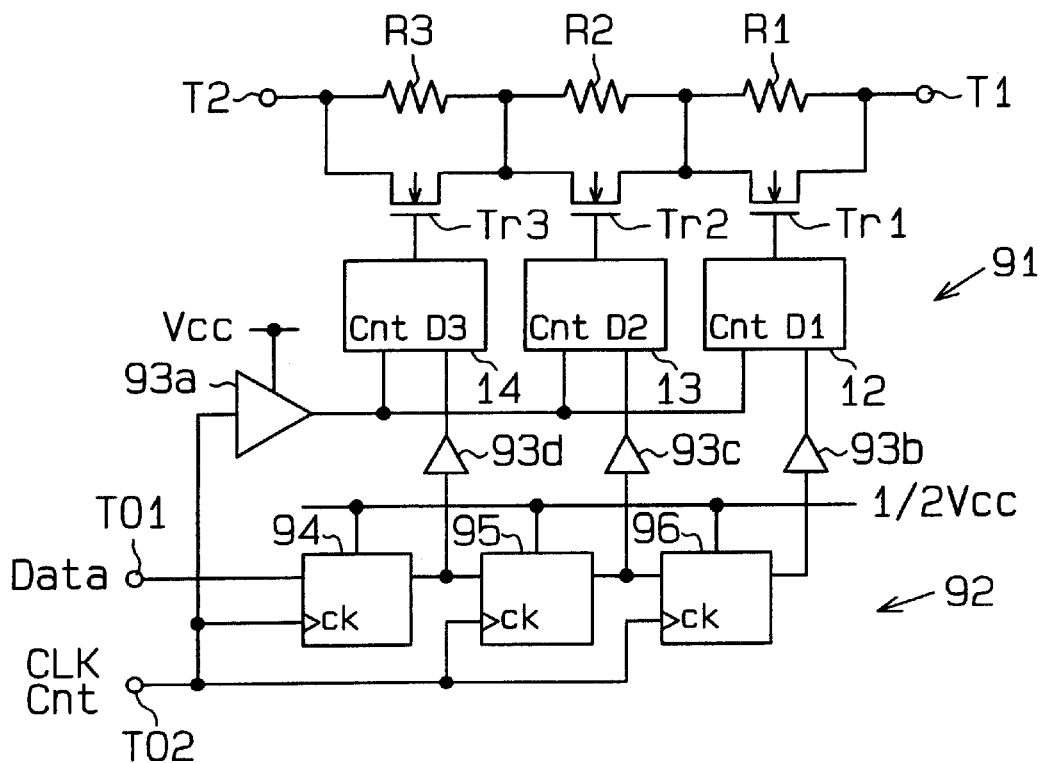
FIG. 16 is a circuit diagram of an adjustment circuit according to a seventh embodiment of the present invention.
Figure 17:
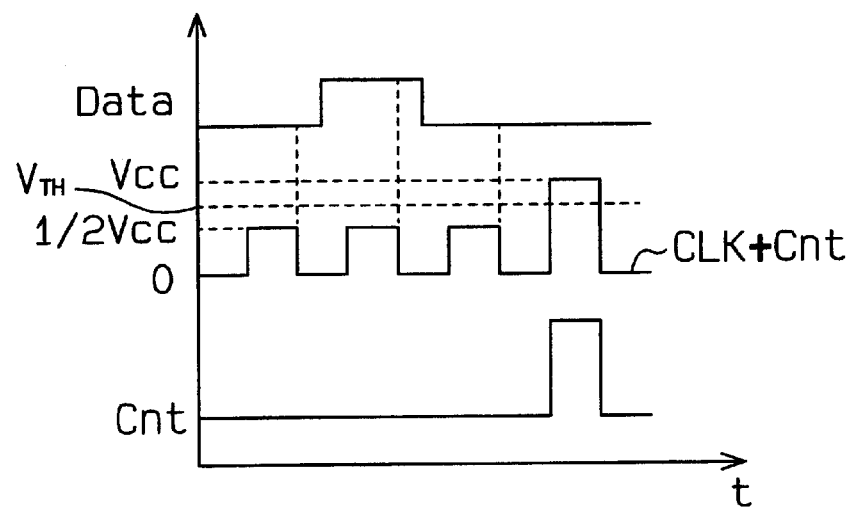
FIG. 17 is an operation waveform diagram of the adjustment circuit of FIG. 16.

The difference between an adjustment circuit 91 according to a seventh embodiment of the present invention and the adjustment circuit 11 of FIG. 1 will mainly be described with reference to FIGS. 16 and 17 hereinafter.

The adjustment circuit 91 includes a serial/parallel conversion circuit 92 and comparators 93a to 93d. The serial/parallel conversion circuit 92 preferably includes three flip-flop circuits 94 to 96 corresponding to adjustment elements (resistors R1 to R3).

An operation power supply V1 having a predetermined middle potential (for example, ½Vcc) between the first power supply Vcc and the second power supply GND is supplied to the respective flip-flop circuits 94 to 96. The first flip-flop circuit 94 has a data input terminal connected to a first external terminal TO1. The first flip-flop circuit 94 reverses a data signal Data from the data input terminal TO1 to supply data signals D1 to D3 to the respective trimming circuits 12 to 14. The respective flip-flop circuits 94 to 96 include clock terminals connected to a second external terminal TO2. The respective flip-flop circuits 94 to 96 receive a clock signal CLK for shift operation via the second external terminal TO2. The respective flip-flop circuits 94 to 96 supply latch data signals D1 to D3 of the data signal Data to the respective trimming circuits 12 to 14 via the comparators 93b to 93d in accordance with a falling edge of the clock signal CLK.

Moreover, the control signal is supplied to the respective trimming circuits 12 to 14 via the second external terminal TO2. Concretely, a synthesized signal of the clock signal CLK fluctuating between the second power supply GND and the operation power supply V1, and the control signal Cnt fluctuating between the second power supply GND and the first power supply Vcc is supplied to the second external terminal TO2. The comparator 93a separates the control signal Cnt from the synthesized signal. A threshold voltage VTH of the comparator 93a is set in such a manner that when the potential of the signal supplied to the comparator 93a is less than the operation power supply V1, the comparator 93a outputs the L-level control signal Cnt. When the potential is equal to or more than the operation power supply V1, the comparator 93a outputs the H-level control signal Cnt. When the H-level control signal Cnt is supplied to the respective trimming circuits 12 to 14, the trimming circuits 12 to 14 process the corresponding trimming elements in accordance with the levels of the data signals D1 to D3.

The first and second external terminals TO1, TO2 are electrodes (pads) formed on the substrate. As described above, the adjustment circuit 91 may be provided with only two pads regardless of the number of adjustment elements (resistors R1 to R3)

An operation of the adjustment circuit 91 will next be described with reference to FIG. 17.

First, the data signal Data having a waveform for performing hypothetical breakage is supplied to the adjustment circuit 91 in synchronization with the clock signal CLK. The flip-flop circuits 94 to 96 latch the data signal Data, and generate the data signals D1 to D3 in response to the falling edge of the clock signal CLK. The flip-flop circuits 94 to 96 supply the data signals D1 to D3 to the trimming circuits 12 to 14 via the comparators 93b to 93d. Thereby, trimming conditions are determined.

Subsequently, the respective flip-flop circuits 94–96 are set based on the trimming conditions to selectively activate the data signals D1 to D3 as trimming objects. For example, the flip-flop circuit 95 is set so that the data signal D2 becomes active. Thereafter, when the H-level signal is applied to the second external terminal TO2, the H-level control signal Cnt is supplied to the respective trimming circuits 12 to 14 via the comparator 93a. Thereby, the desired resistors R1 to R3 are trimmed.

According to the seventh embodiment, the following advantage is obtained.

In the adjustment circuit 91, a plurality of adjustment elements (resistors R1 to R3) are trimmed using two external terminals TO1, TO2. The number of external terminals is less than that of the prior art. Therefore, the semiconductor apparatus including the adjustment circuit 91 is relatively small.

The seventh embodiment may be modified as follows.

Instead of the comparators 93a to 93d, a level shift circuit may be used.

The threshold voltage VTH may be set in the respective trimming circuits 12, 13, 14, instead of the comparators 93a to 93d.

Figure 18:
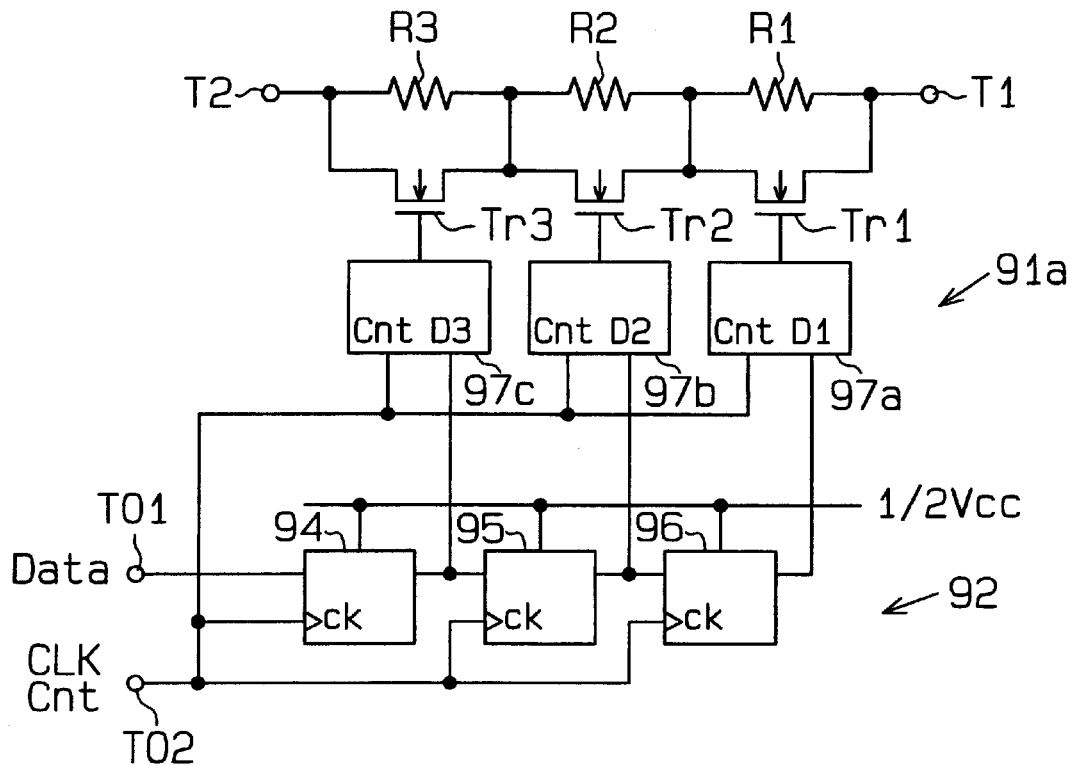
FIG. 18 is a circuit diagram of a modification of the adjustment circuit of FIG. 16.
Figure 19:
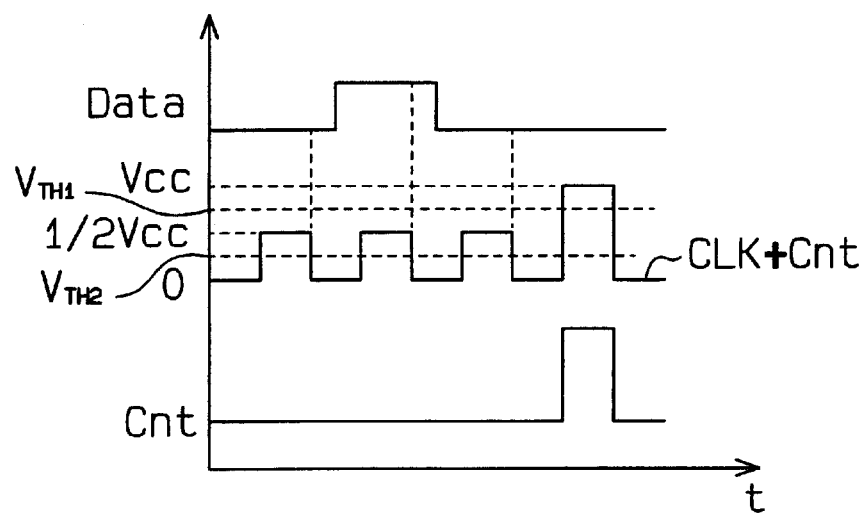
FIG. 19 is an operation waveform diagram of the adjustment circuit of FIG. 18.

For example, as shown in FIG. 18, an adjustment circuit 91a includes three trimming circuits 97a to 97c. Each of the trimming circuits 97a to 97c includes a first terminal for receiving the control signal Cnt and a second terminal for receiving the data signals D1 to D3. A threshold voltage VTH1 of the first terminal is set between the first power supply Vcc and the operation power supply V1 (=+e,fra 12+ee Vcc). A threshold voltage VTH2 of the second terminal is set between the operation power supply V1 and the second power supply GND (=0V). Since the threshold voltage VTH1 is different from VTH2, the respective trimming circuits 97a to 97c can distinguish the data signals D1 to D3 and clock signal CLK from the control signal Cnt. FIG. 19 is a timing chart showing the operation of the adjustment circuit 91a. As shown in FIG. 19, the adjustment circuit 91a can perform trimming similar to the adjustment circuit 91 of FIG. 16. Since the adjustment circuit 91a does not require the comparator 93 of FIG. 16, a smaller-sized semiconductor apparatus can be provided.

Figure 12:
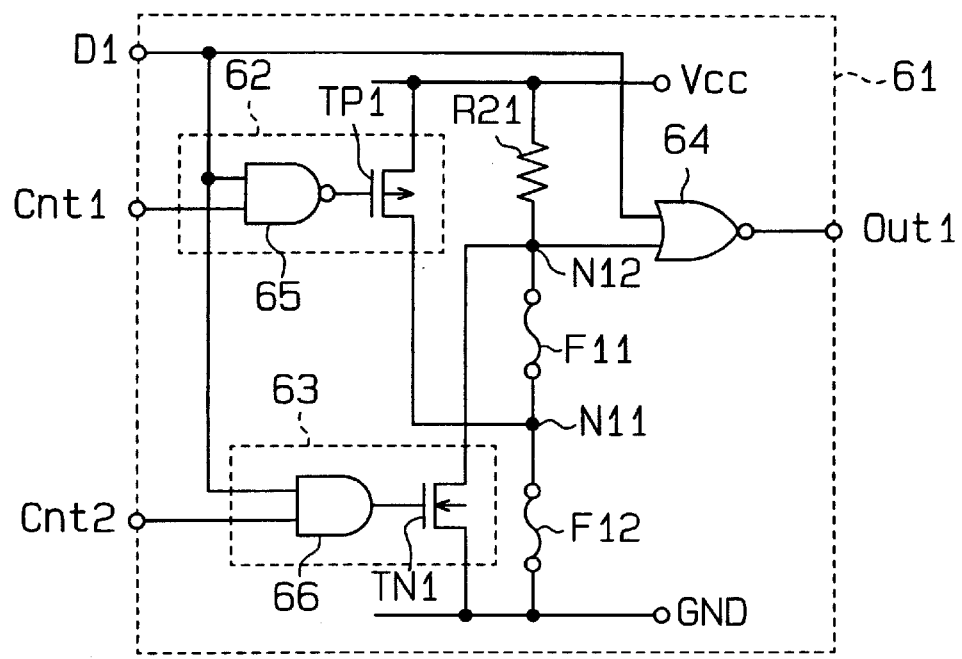
FIG. 12 is a circuit diagram of a trimming circuit according to a third embodiment of the present invention.

The trimming circuits 97a to 97c of the adjustment circuit 91a may be replaced with the trimming circuit 61 of FIG. 12. In this case, the comparator is connected to the first external terminal TO1. Moreover, when the data signal Data is set to HH level (a level higher than the level of the signal supplied to the respective flip-flop circuits 94 to 96, for example, Vcc level), the second control signal Cnt2 is generated.

The first to seventh embodiments may be modified as follows.

The adjustment circuits 11, 31, 91, 91a may selectively short-circuit some of a plurality of resistors of the resistance circuit for generating the standard voltage, instead of the resistor connected between the internal terminals T1 and T2.

Instead of the resistors R1, R2, R3, a capacitor for adjusting a capacitance value between the internal terminals T1 and T2 may be used as the adjustment element.

The number of adjustment elements or trimming circuits may appropriately be changed. For the semiconductor apparatus of the seventh embodiment, as compared with the conventional semiconductor apparatus, when the number of adjustment elements increases, the apparatus is more effectively miniaturized.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A trimming circuit comprising:
    a resistor connected to either one of a first power supply and a second power supply;
    at least one trimming element connected between the other one of the first power supply and the second power supply, and the resistor;
    at least one resistance bypass circuit, connected to a node between the resistor and the at least one trimming element, for selectively performing ordinary breakage and hypothetical breakage of the trimming element in accordance with a control signal and a data signal, wherein the at least one resistance bypass circuit holds the at least one trimming element in an unbroken state in accordance with the control signal during the hypothetical breakage, and wherein the at least one resistance bypass circuit connects the at least one trimming element to the first power supply and the second power supply in accordance with the control signal and the data signal and breaks the trimming element during the ordinary breakage; and
    an output changeover circuit, connected to the node, for generating a first output signal in accordance with a state of the at least one trimming element during the ordinary breakage, and for generating a second output signal in accordance with the data signal during the hypothetical breakage.

2. The trimming circuit according to claim 1, wherein the at least one trimming element includes a first trimming element and a second trimming element, and the at least one resistance bypass circuit breaks one of the first trimming element and the second trimming element in accordance with the data signal.

3. The trimming circuit according to claim 1, wherein the at least one trimming element includes a first meltdown type trimming element connected between the resistor and the first power supply, and a second short-circuit type trimming element connected between the resistor and the second power supply, and the resistance bypass circuit breaks the first trimming element in accordance with the control signal and the data signal, and short-circuits the second trimming element.

4. The trimming circuit according to claim 1, wherein the at least one trimming element includes a first trimming element connected to either one of the first power supply and the second power supply, and a second trimming element connected between the resistor and the first trimming element, and the at least one resistance bypass circuit includes a first resistance bypass circuit for receiving a first control signal and the data signal and breaking the first trimming element, and a second resistance bypass circuit for receiving a second control signal and the data signal and cooperating with the first resistance bypass circuit to break the second trimming element.

5. The trimming circuit according to claim 1, wherein the at least one trimming element includes a first trimming element connected to either one of the first power supply and the second power supply, and a second trimming element connected between the resistor and the first trimming element, the at least one resistance bypass circuit includes a first resistance bypass circuit for breaking the first trimming element, and a second resistance bypass circuit connected to a node between the first trimming element and the second trimming element, and the second resistance bypass circuit disables the breaking of the second trimming element when the first trimming element is in an unbroken state, and cooperates with the first resistance bypass circuit to break the second trimming element when the first trimming element is broken.

6. The trimming circuit according to claim 1, wherein the at least one trimming element includes a first trimming element connected to the first power supply, a second trimming element connected between the first trimming element and the resistor, a third trimming element connected to the second power supply, and a fourth trimming element connected between the third trimming element and the resistor, and the resistance bypass circuit includes a first resistance bypass circuit for breaking the first trimming element, a second resistance bypass circuit for cooperating with the first resistance bypass circuit to break the second trimming element, a third resistance bypass circuit for breaking the third trimming element, and a fourth resistance bypass circuit for cooperating with the third resistance bypass circuit to break the fourth trimming element.

7. A trimming circuit comprising:
    a resistor connected to either one of a first power supply and a second power supply;
    at least one trimming element connected between the other one of the first power supply and the second power supply, and the resistor;
    at least one resistance bypass circuit, connected to the at least one trimming element, for supplying the first power supply and the second power supply to the trimming element in accordance with a control signal and a data signal to selectively perform ordinary short-circuit and hypothetical short-circuit of the trimming element, the resistance bypass circuit holding the trimming element in a non-short-circuit state in accordance with the control signal during the hypothetical short-circuit, the resistance bypass circuit connecting the trimming element to the first power supply and the second power supply in accordance with the control signal and the data signal to short-circuit the trimming element during the ordinary short-circuit; and
    an output changeover circuit, connected to the node, for generating a first output signal in accordance with a state of the at least one trimming element during the ordinary short-circuit, and for generating a second output signal in accordance with the data signal during the hypothetical short-circuit.

8. The trimming circuit according to claim 7, wherein the at least one trimming element includes a first trimming element connected between the resistor and the first power supply, and a second trimming element connected between the resistor and the second power supply, and the at least one resistance bypass circuit short-circuits the first trimming element or the second trimming element in accordance with the data signal.

9. An adjustment circuit for controlling a plurality of adjustment elements, comprising:
    a plurality of switch elements connected in parallel with the plurality of adjustment elements; and a plurality of trimming circuits, connected to the plurality of switch elements, for receiving a plurality of data signals and a common control signal, each trimming circuit including:
  a resistor connected to either one of a first power supply and a second power supply;
  at least one trimming element connected between the other one of the first power supply and the second power supply, and the resistor;
  at least one resistance bypass circuit, connected to a node between the resistor and the at least one trimming element, for selectively performing ordinary breakage and hypothetical breakage of the trimming element in accordance with the control signal and the data signal, the at least one resistance bypass circuit holding the at least one trimming element in an unbroken state in accordance with the control signal during the hypothetical breakage, the at least one resistance bypass circuit connecting the at least one trimming element to the first power supply and the second power supply in accordance with the control signal and the data signal and breaking the trimming element during the ordinary breakage; and
  an output changeover circuit, connected to the node, for generating a first output signal in accordance with a state of the at least one trimming element during the ordinary breakage, and for generating a second output signal in accordance with the data signal during the hypothetical breakage.

10. The adjustment circuit according to claim 9, further comprising a serial/parallel conversion circuit connected to the plurality of trimming circuits, for generating the plurality of data signals from a serial signal.

11. The adjustment circuit according to claim 10, further comprising a comparator connected to the plurality of trimming circuits, for receiving a superimposed control signal generated by superimposing the control signal onto a clock signal, and supplying the control signal to the plurality of trimming circuits.

12. The adjustment circuit according to claim 10, wherein the serial/parallel conversion circuit includes a plurality of flip-flop circuits connected in series, each flip-flop circuit having a first input terminal for receiving a superimposed control signal generated by superimposing the control signal onto a clock signal, and a second input terminal for receiving the data signal, wherein the first input terminal is set in such a manner that the control signal is distinguishable from the clock signal, and has a first threshold value different from a second threshold value of the second input terminal.

13. A semiconductor apparatus comprising:
  a plurality of data terminals for receiving a plurality of data signals;
  a control terminal for receiving a common control signal;
  a plurality of adjustment elements;
  a plurality of switch elements connected in parallel with the plurality of adjustment elements; and
  an adjustment circuit, connected to the plurality of switch elements, the plurality of data terminals and the control terminal, for switching the plurality of switch elements in accordance with the plurality of data signals and the common control signal to control the adjustment elements, the adjustment circuit having a plurality of trimming circuits connected to the plurality of switch elements, each trimming circuit including:
    a resistor connected to either one of a first power supply and a second power supply;
    at least one trimming element connected between the other one of the first power supply and the second power supply, and the resistor;
    at least one resistance bypass circuit, connected to a node between the resistor and the at least one trimming element, for selectively performing ordinary breakage and hypothetical breakage of the trimming element in accordance with the control signal and the data signal, the at least one resistance bypass circuit holding the at least one trimming element in an unbroken state in accordance with the control signal during the hypothetical breakage, the at least one resistance bypass circuit connecting the at least one trimming element to the first power supply and the second power supply in accordance with the control signal and the data signal and breaking the trimming element during the ordinary breakage; and
    an output changeover circuit for generating a first output signal in accordance with a state of the at least one trimming element during the ordinary breakage, and for generating a second output signal in accordance with the data signal during the hypothetical breakage.

14. A semiconductor apparatus comprising:
  a plurality of data terminals for receiving a plurality of data signals;
  a control terminal for receiving a common control signal;
  a plurality of adjustment elements;
  a plurality of switch elements connected in parallel with the plurality of adjustment elements; and
  an adjustment circuit, connected to the plurality of switch elements, the plurality of data terminals and the control terminal, for switching the plurality of switch elements in accordance with the plurality of data signals and the common control signal to control the adjustment elements, the adjustment circuit having a plurality of trimming circuits connected to the plurality of switch elements, each trimming circuit including:
    a resistor connected to either one of a first power supply and a second power supply;
    at least one trimming element connected between the other one of the first power supply and the second power supply, and the resistor;
    at least one resistance bypass circuit, connected to the at least one trimming element, for supplying the first power supply and the second power supply to the trimming element in accordance with the control signal and the data signal to selectively perform ordinary short-circuit and hypothetical short-circuit of the trimming element, the resistance bypass circuit holding the trimming element in a non-short-circuit state in accordance with the control signal during the hypothetical short-circuit, the resistance bypass circuit connecting the trimming element to the first power supply and the second power supply in accordance with the control signal and the data signal to short-circuit the trimming element during the ordinary short-circuit; and
    an output changeover circuit, connected to the node, for generating a first output signal in accordance with a state of the at least one trimming element during the ordinary short-circuit, and generating a second output signal in accordance with the data signal during the hypothetical short-circuit.

15. A trimming circuit connected to a control terminal for receiving a control signal and to a data terminal for receiving a data signal, comprising:

a resistor connected to either one of a high-potential power supply and a low-potential power supply;

at least one trimming element connected between the other one of the high-potential power supply and the low-potential power supply, and the resistor;

at least one breakdown changeover circuit, connected to a node between the at least one trimming element and the resistor, the control terminal, and the data terminal, for selectively performing ordinary breakdown and hypothetical breakdown of the trimming element in accordance with the control signal and the data signal, the at least one breakdown changeover circuit holding the trimming element in an unbroken state in accordance with the control signal during the hypothetical breakdown, the at least one breakdown changeover circuit selectively supplying a breakdown current of the trimming element to the corresponding trimming element in accordance with the control signal and the data signal during the ordinary breakdown; and an output changeover circuit, connected to the data terminal and the node, for switching an output signal in accordance with the data signal and a potential of the node, the output signal including an ordinary output signal following a state of the at least one trimming element, and a hypothetical output signal following the data signal.

* * * * *